(12) United States Patent
Mizuno et al.

(10) Patent No.: US 7,728,710 B2
(45) Date of Patent: Jun. 1, 2010

(54) ELECTRONIC PARTS BOARD AND METHOD OF PRODUCING THE SAME

(75) Inventors: Shinji Mizuno, Kanagawa (JP); Koji Mitsui, Kanagawa (JP); Katsutoshi Yanoshita, Kanagawa (JP); Shinichi Suzuki, Kanagawa (JP); Takashi Shinoki, Kanagawa (JP); Kazutaka Nakagome, Kanagawa (JP); Naoki Fukuda, Kanagawa (JP); Kozo Morita, Kanagawa (JP); Daisuke Makino, Kanagawa (JP)

(73) Assignee: Teikoku Tsushin Kogyo Co., Ltd., Kanagawa-ken (JP)

( * ) Notice: Subject to any disclaimer, the term of this patent is extended or adjusted under 35 U.S.C. 154(b) by 1364 days.

(21) Appl. No.: 10/541,459

(22) PCT Filed: Feb. 5, 2004

(86) PCT No.: PCT/JP2004/001199

§ 371 (c)(1),
(2), (4) Date: Jul. 6, 2005

(87) PCT Pub. No.: WO2004/072993

PCT Pub. Date: Aug. 26, 2004

(65) Prior Publication Data

US 2006/0040094 A1 Feb. 23, 2006

(30) Foreign Application Priority Data

| Feb. 12, 2003 | (JP) | 2003-34180 |
| Feb. 12, 2003 | (JP) | 2003-34181 |
| Dec. 8, 2003 | (JP) | 2003-409463 |
| Dec. 17, 2003 | (JP) | 2003-420047 |
| Dec. 17, 2003 | (JP) | 2003-420048 |
| Dec. 19, 2003 | (JP) | 2003-423308 |

(51) Int. Cl.
*H01C 10/32* (2006.01)

(52) U.S. Cl. ............... 338/162; 338/190; 29/610.1

(58) Field of Classification Search ......... 338/160–162, 338/118, 190, 202; 29/620, 610.1
See application file for complete search history.

(56) References Cited

U.S. PATENT DOCUMENTS 5,071,611 A * 12/1991 Yagi et al. .......... 264/154

(Continued)

FOREIGN PATENT DOCUMENTS

DE 38 84 718 5/1994

(Continued)

OTHER PUBLICATIONS

German Office Action (in English language) issued May 4, 2009 in corresponding German Patent Application No. 11 2004 000 260.5-34.

*Primary Examiner*—Kyung Lee
(74) *Attorney, Agent, or Firm*—Wenderoth, Lind & Ponack, L.L.P.

(57) ABSTRACT

An electronic component substrate (1-1) includes an insulating base (10) and a flexible circuit board (20) mounted on the insulating base (10). The flexible circuit board (20) is a synthetic resin film provided thereon with terminal patterns (29) and a conductor pattern (25) whose surface is slidingly contacted with a slider. The insulating base (10) is a synthetic resin molded piece. The flexible circuit board (20) is insert-molded to the insulating base (10). The electronic component substrate (1-1) is produced by preparing the flexible circuit board (20) and first and second mold members (41, 45) having a cavity (C1) with a shape that corresponds to the external shape of the electronic component substrate (1-1). Then, the flexible circuit board (20) is accommodated in the cavity (C1) between the first and second mold members (41,45), and the cavity (C1) is filled with a molten molding resin. After the molding resin has solidified, the first and second mold members (41, 45) are removed.

10 Claims, 28 Drawing Sheets

U.S. PATENT DOCUMENTS

| | | | | |
|---|---|---|---|---|
| 5,631,623 | A | * | 5/1997 | Yoshimura ................ 338/142 |
| 2002/0070843 | A1 | | 6/2002 | Doi et al. |

FOREIGN PATENT DOCUMENTS

| DE | 44 02 848 | 8/1994 |
|---|---|---|
| EP | 0 304 112 | 2/1989 |
| JP | 2-216896 | 8/1990 |
| JP | 7-22215 | 1/1995 |
| JP | 2001-15308 | 1/2001 |
| JP | 2002-289411 | 10/2002 |

* cited by examiner

Fig.9
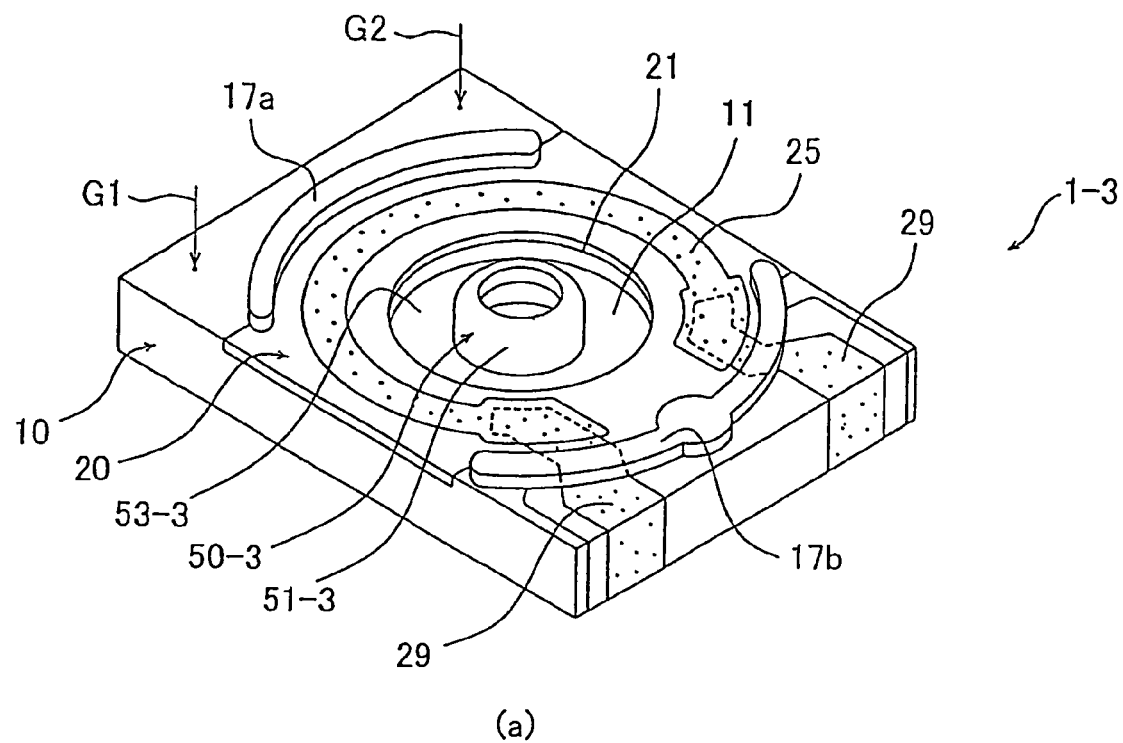
(a)
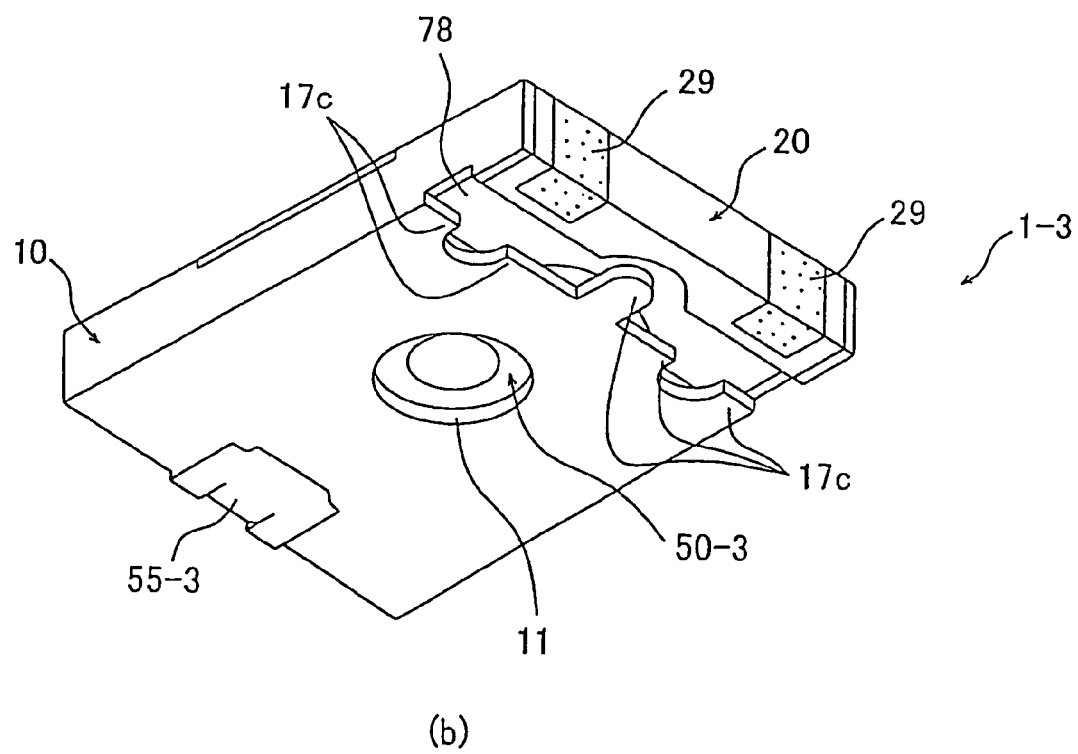
(b)

Fig.25
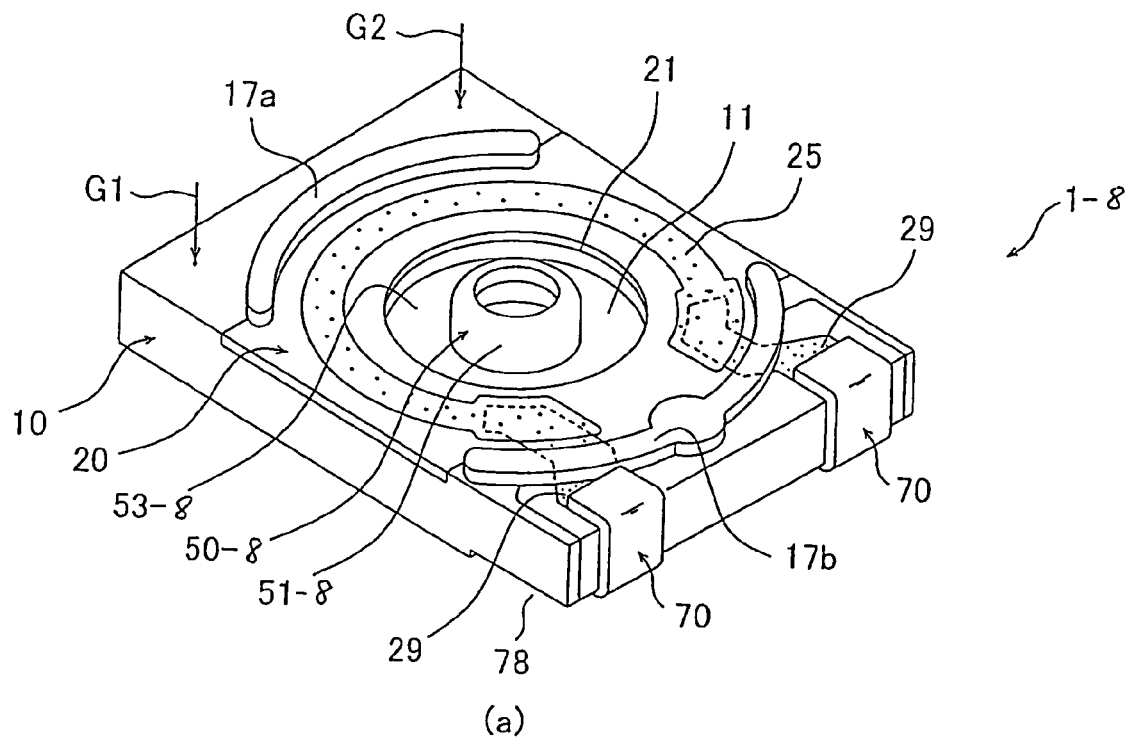
(a)
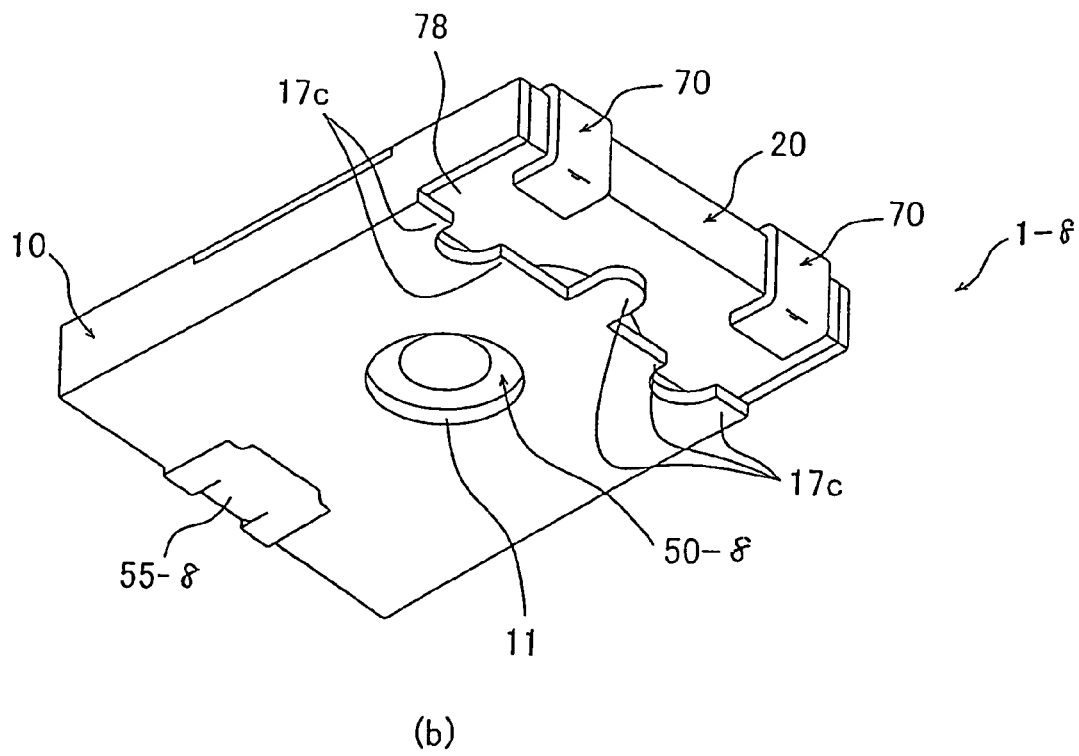
(b)

Fig.29
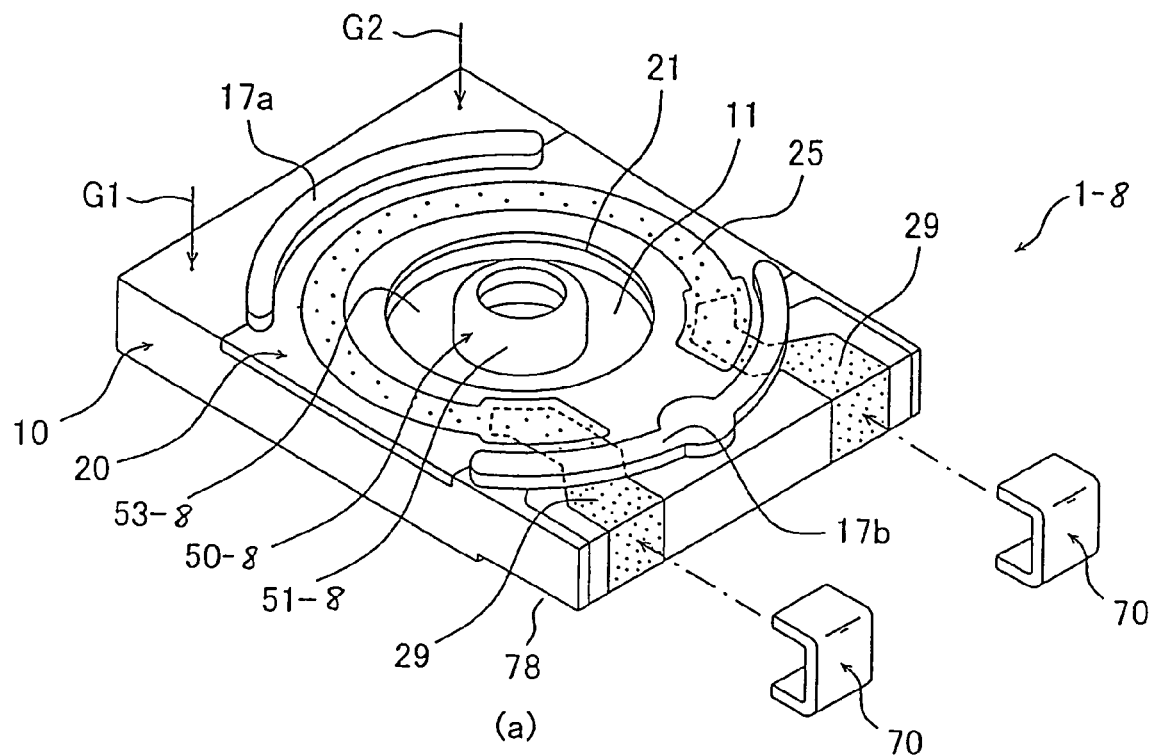
(a)
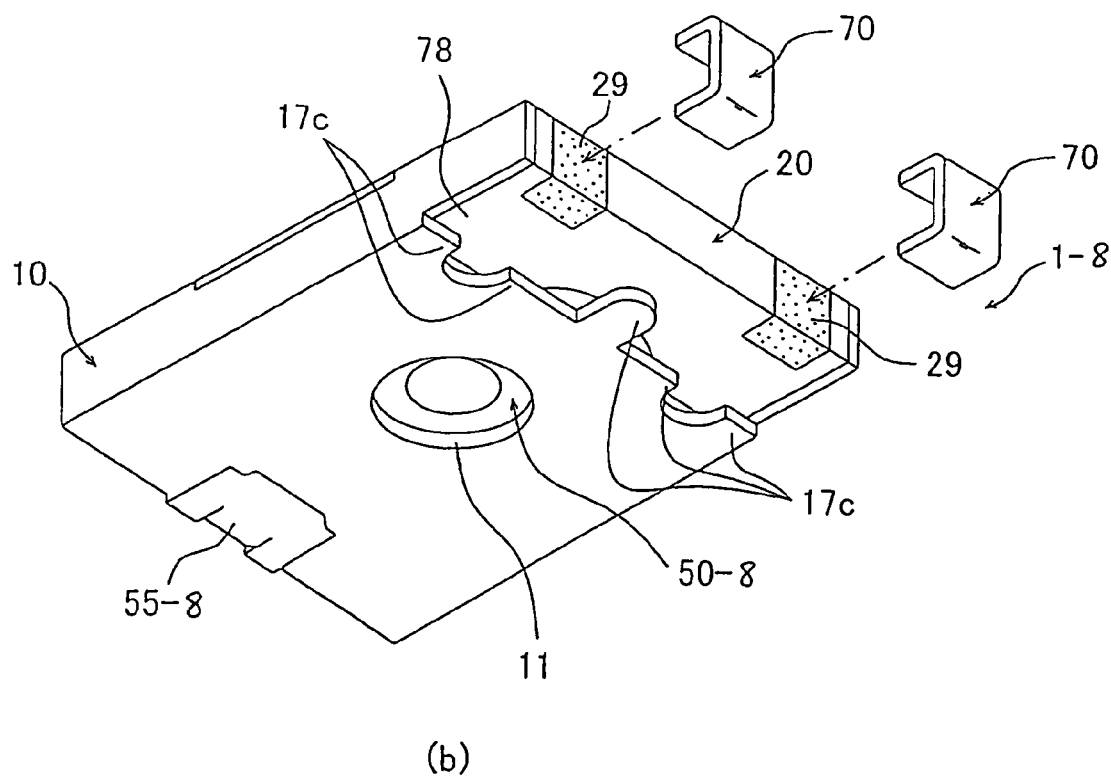
(b)

ELECTRONIC PARTS BOARD AND METHOD OF PRODUCING THE SAME

BACKGROUND OF THE INVENTION

1. Technical Field

The present invention relates to a substrate for an electronic component that is usable for a pre-set variable resistor or the like, and also relates to a method of producing the electronic component substrate.

2. Description of Related Art

Conventionally, a chip type pre-set variable resistor has a ceramic substrate, a slider and a collector plate. The slider is installed on the upper side of the ceramic substrate, and the collector plate is installed on the lower side of the ceramic substrate. In fabrication, a tubular projection provided on the collector plate is inserted through a through-hole provided in the ceramic substrate and further through a fitting hole provided in the slider, and the distal end of the tubular projection is caulked, thereby rotatably securing the slider to the ceramic substrate. Rotating the slider causes a sliding contact provided on the slider to slide on the surface of a horseshoe-shaped resistor pattern provided on the ceramic substrate, thereby varying the resistance between the collector plate and terminal patterns provided at both ends of the resistor pattern.

However, the above-described pre-set variable resistor uses a ceramic substrate and needs to fire a resistor pattern onto the ceramic substrate. Therefore, the production efficiency is inferior, and the material cost is high. Accordingly, there has been a limit to the reduction in cost of the pre-set variable resistor. Further, because the ceramic substrate is easily breakable, it has been difficult to achieve a further reduction in thickness of the pre-set variable resistor.

Accordingly, an object of the present invention is to provide a substrate for an electronic component that can be produced easily at an improved efficiency and at a reduced material cost and is therefore capable of achieving a cost reduction and also capable of attaining a further reduction in thickness easily, and also provide a method of producing the electronic component substrate.

SUMMARY OF THE INVENTION

The present invention resides in a substrate for an electronic component that includes an insulating base and a flexible circuit board mounted on the insulating base, the flexible circuit board being a synthetic resin film provided thereon with terminal patterns and a conductor pattern whose surface is slidingly contacted with a slider, which is characterized in that the insulating base is a synthetic resin molded piece, and the flexible circuit board is insert-molded to the insulating base. According to this invention, the insulating base is made by molding a synthetic resin. Therefore, the production thereof is facilitated, and the material cost can be reduced in comparison to the ceramic substrate. It is also possible to achieve a reduction in thickness easily and at reduced cost. Further, because the flexible circuit board is insert-molded to the insulating base, the manufacture is facilitated. Further, the electronic component substrate can be mass-produced easily by simultaneously forming a large number of sets of conductor patterns on a synthetic resin film, and then simultaneously molding insulating bases together with respective flexible circuit boards provided with respective conductor patterns in each set, followed by cutting the integrally connected flexible circuit boards from each other, thereby enabling each individual discrete product to be obtained. Thus, productivity is improved.

A collector plate, provided with a tubular projection, is insert-molded to the insulating base in such a way that the tubular projection is positioned in through-holes respectively provided in the insulating base and the flexible circuit board. According to this invention, a collector plate provided with a tubular projection is insert-molded to the insulating base. Therefore, the insulating base and the collector plate can be integrated into one unit. Accordingly, it is possible to simplify the process of producing a rotating electronic component, e.g. a variable resistor, using the substrate for an electronic component.

The flexible circuit board is mounted on the insulating base by insert molding in a folded state so that the surface of the flexible circuit board is exposed on the upper and lower sides of the insulating base. According to this invention, the substrate for an electronic component can be easily fabricated into a chip.

The insulating base is provided with a retaining portion for firmly securing the flexible circuit board to the insulating base. According to this invention, the insulating base is provided with a retaining portion for firmly securing the flexible circuit board to the insulating base. Therefore, the flexible circuit board can be firmly secured to the insulating base. Even if the flexible circuit board and the insulating base are made of a combination of materials that are not easily fixed to each other only with the heat and pressure applied during insert molding, the flexible circuit board can be easily and firmly secured to the insulating base without the occurrence of such a problem that the flexible circuit board separates from the surface of the insulating base. The retaining portion is suitable for use in a structure in which the flexible circuit board is insert-molded to the insulating base in a folded state so that the surface of the flexible circuit board is exposed on the upper and lower sides of the insulating base.

The conductor pattern is formed from a metal thin film deposited by physical vapor deposition or chemical vapor deposition. According to this invention, it is possible to obtain favorable temperature and humidity characteristics comparable to those in the case of a conductor pattern fired onto a ceramic substrate at high temperature. Moreover, because vapor deposition is used, the production efficiency is better than in the case of firing onto a ceramic substrate.

Further, terminal plates are mounted on an end portion of the insulating base in electrical connection with the terminal patterns provided on the flexible circuit board. According to this invention, because the terminal plates are used, it is easy to secure the electronic component substrate to another circuit board with a connecting means accompanied by high temperature. On the other hand, it is possible to use materials that may be easily affected by heat for the terminal patterns and the flexible circuit board. The terminal plates can serve also as mechanical securing means for securing the flexible circuit board to the insulating base by clamping them together.

The insulating base is provided with a retaining portion for firmly securing the flexible circuit board to the insulating base. According to this invention, the retaining portion enables the flexible circuit board to be firmly secured to the insulating base. Even if the flexible circuit board and the insulating base are made of a combination of materials that are not easily fixed to each other only with the heat and pressure applied during insert molding, the flexible circuit board can be easily and firmly secured to the insulating base without the occurrence of such a problem that the flexible circuit board separates from the surface of the insulating base.

The terminal plates are insert-molded to the insulating base. According to this invention, it becomes unnecessary to carry out the step of mounting the terminal plates onto the insulating base, which would otherwise be necessary to carry out as a separate step. In addition, the terminal plates can be secured to the insulating base even more surely, and electrical connection of the terminal plates to the terminal patterns can be effected even more reliably.

A collector plate is insert-molded to the insulating base. According to this invention, the insulating base and the collector plate can be integrated into one unit. Therefore, it is possible to simplify the process of producing a rotating electronic component, e.g. a variable resistor, using the substrate for an electronic component.

The conductor pattern is formed from a metal thin film deposited by physical vapor deposition or chemical vapor deposition. According to this invention, it is possible to obtain favorable temperature and humidity characteristics comparable to those in the case of a conductor pattern fired onto a ceramic substrate at high temperature. Moreover, because vapor deposition is used, the production efficiency is better than in the case of firing onto a ceramic substrate.

The invention also includes a method of producing an electronic component substrate that includes: preparing a flexible circuit board comprising a synthetic resin film provided thereon with a conductor pattern, a surface of which is slidingly contacted with a slider, and terminal patterns connected to the conductor pattern, and further preparing a mold having a cavity with a shape that corresponds to the external shape of the electronic component substrate to be produced; accommodating the flexible circuit board in the cavity of the mold in such a manner that a surface of the flexible circuit board where the conductor pattern is provided is abutted against one inner surface of the cavity, and a portion of the flexible circuit board on a side thereof where the terminal patterns are provided is folded over toward the other inner surface of the cavity; filling a molten molding resin into the cavity, thereby bringing the folded portion of the flexible circuit board into close contact with a cavity wall area extending from the upper surface to the lower surface of the cavity along one outer peripheral side surface thereof; and removing the mold after the filled molding resin has been solidified, whereby the flexible circuit board is mounted on an insulating base made of the molding resin in such a way that a portion of the flexible circuit board where the conductor pattern is provided is exposed on the upper side of the insulating base, and a portion of the flexible circuit board on the side thereof where the terminal patterns are provided is exposed in a folded state over an area extending from one outer peripheral side to the lower side of the insulating base. According to this invention, it is possible to easily produce an electronic component substrate having a structure in which a conductor pattern is exposed on the upper side of an insulating base and terminal patterns are exposed over an area extending from one outer peripheral side to the lower side of the insulating base, simply by insert-molding the flexible circuit board in the cavity of the mold. Accordingly, the production cost can be reduced. In addition, the material cost can be reduced in comparison to the ceramic substrate. It is also possible to achieve a reduction in thickness easily and at reduced cost. Further, the electronic component substrate can be mass-produced easily by simultaneously forming a large number of sets of conductor patterns on a synthetic resin film, and then simultaneously molding insulating bases together with respective flexible circuit boards provided with respective conductor patterns in each set, followed by cutting the integrally connected flexible circuit boards from each other, thereby enabling each individual discrete product to be obtained. Thus, productivity is improved.

In the above-described method a collector plate made of a metal sheet is accommodated in the cavity of the mold at the same time as the flexible circuit board is accommodated in the cavity, thereby embedding the collector plate in the insulating base made of the molding resin. According to this invention, it is possible to easily produce an electronic component substrate having a structure in which a conductor pattern is exposed on the upper side of an insulating base and terminal patterns are exposed over an area extending from one outer peripheral side to the lower side of the insulating base and further a collector plate is mounted, simply by insert-molding the flexible circuit board and the collector plate in the cavity of the mold. Accordingly, productivity is improved, and the production cost can be reduced.

The invention also includes a method of producing an electronic component substrate that includes: preparing a flexible circuit board comprising a synthetic resin film provided thereon with a conductor pattern, a surface of which is slidingly contacted with a slider, and terminal patterns connected to the conductor pattern, and further preparing terminal plates made of metal sheets and a mold having a cavity with a shape that corresponds to the external shape of the electronic component substrate to be produced; accommodating the flexible circuit board in the cavity of the mold in such a manner that a surface of the flexible circuit board where the conductor pattern is provided is abutted against one inner surface of the cavity; filling a molten molding resin into the cavity, and removing the mold after the filled molding resin has been solidified, whereby the flexible circuit board is mounted on an insulating base made of the molding resin in such a way that the conductor pattern and the terminal patterns are exposed; and mounting the terminal plates on an end portion of the insulating base in electrical connection with the terminal patterns provided on the flexible circuit board. According to this invention, the flexible circuit board is insert-molded to the insulating base. Therefore, the manufacture is facilitated, and the production cost can be reduced. In addition, because the insulating base is a synthetic resin molded piece, the production thereof is facilitated, and the material cost can be reduced in comparison to the ceramic substrate. It is also possible to achieve a reduction in thickness easily and at reduced cost. Further, the electronic component substrate can be mass-produced easily by simultaneously forming a large number of sets of conductor patterns on a synthetic resin film, and then simultaneously molding insulating bases together with respective flexible circuit boards provided with respective conductor patterns in each set, followed by cutting the integrally connected flexible circuit boards from each other, thereby enabling each individual discrete product to be obtained. Thus, productivity is improved.

The invention also includes a method of producing an electronic component substrate that includes: preparing a flexible circuit board comprising a synthetic resin film provided thereon with a conductor pattern, a surface of which is slidingly contacted with a slider, and terminal patterns connected to the conductor pattern, and further preparing terminal plates made of metal sheets and a mold having a cavity with a shape that corresponds to the external shape of the electronic component substrate to be produced; accommodating the flexible circuit board and the terminal plates in the cavity of the mold in such a manner that a surface of the flexible circuit board where the conductor pattern is provided is abutted against one inner surface of the cavity, and at the same time, the terminal plates are partially abutted against or opposed to the terminal patterns on the flexible circuit board; and filling a molten molding resin into the cavity, and removing the mold after the filled molding resin has been solidified, whereby the flexible circuit board is mounted on an insulating base made of the molding resin in such a way that the conductor pattern and the terminal patterns are exposed, and at the same time, the terminal plates are mounted on an end portion of the insulating base in electrical connection with the terminal patterns provided on the flexible circuit board. According to this invention, not only the flexible circuit board but also the terminal plates are insert-molded to the insulating base. Therefore, it becomes unnecessary to carry out the step of mounting the terminal plates onto the insulating base, which would otherwise be necessary to carry out as a separate step. Accordingly, an electronic component substrate that is equipped with terminal plates made of metal sheets can be produced easily, and the production cost can be reduced. In addition, the terminal plates can be secured to the insulating base easily and surely, and electrical connection of the terminal plates to the terminal patterns can be effected easily and reliably. In addition, because the insulating base is a synthetic resin molded piece, the production thereof is facilitated, and the material cost can be reduced in comparison to the ceramic substrate. It is also possible to achieve a reduction in thickness easily and at reduced cost.

The method is characterized in that a collector plate made of a metal sheet is accommodated in the cavity of the mold at the same time as the flexible circuit board is accommodated in the cavity, thereby embedding the collector plate in the insulating base made of the molding resin. According to this invention, the flexible circuit board and the collector plate (or the flexible circuit board, the collector plate and the terminal plates) are insert-molded to the insulating base. Therefore, it becomes unnecessary to carry out the step of mounting the collector plate onto the insulating base, which would otherwise be necessary to carry out as a separate step. Accordingly, the electronic component substrate that is equipped with the collector plate made of a metal sheet (or the terminal plates in addition to the collector plate) can be produced easily, and the production cost can be reduced.

BRIEF DESCRIPTION OF THE DRAWINGS

FIG. 2 is a diagram showing the electronic component substrate 1-1 produced by using the first embodiment of the present invention, in which: FIG. 2(a) is a plan view; FIG. 2(b) is a front view; FIG. 2(c) is a sectional view in the direction of arrows A-A in FIG. 2(a); and FIG. 2(d) is a rear view.

FIG. 5 is a diagram showing a pre-set variable resistor 100-1 constructed by using the electronic component substrate 1-1, in which: FIG. 5(a) is a plan view; FIG. 5(b) is a front view; FIG. 5(c) is a sectional view in the direction of arrows B-B in FIG. 5(a); and FIG. 5(d) is a rear view.

FIG. 6 is a diagram showing an electronic component substrate 1-2 produced by using a second embodiment of the present invention, in which: FIG. 6(a) is a plan view; FIG. 6(b) is a front view; FIG. 6(c) is a sectional view in the direction of arrows D-D in FIG. 6(a); and FIG. 6(d) is a rear view.

FIG. 7 is a diagram showing a pre-set variable resistor 100-2 constructed by using the electronic component substrate 1-2, in which: FIG. 7(a) is a plan view; FIG. 7(b) is a front view; FIG. 7(c) is a sectional view in the direction of arrows E-E in FIG. 7(a); and FIG. 7(d) is a rear view.

FIG. 9 is a diagram showing an electronic component substrate 1-3 produced by using a third embodiment of the present invention, in which: FIG. 9(a) is a perspective view as seen from above; and FIG. 9(b) is a perspective view as seen from below.

FIG. 10 is a diagram showing the electronic component substrate 1-3 produced by using the third embodiment of the present invention, in which: FIG. 10(a) is a plan view; FIG. 10(b) is a front view; FIG. 10(c) is a sectional view in the direction of arrows F-F in FIG. 10(a); and FIG. 10(d) is a rear view.

FIG. 14 is a diagram showing the electronic component substrate 1-4, in which: FIG. 14(a) is a plan view; FIG. 14(b) is a front view; FIG. 14(c) is a sectional view in the direction of arrows G-G in FIG. 14(a); and FIG. 14(d) is a rear view.

FIG. 17 is a diagram showing a pre-set variable resistor 100-4 constructed by using the electronic component substrate 1-4, in which: FIG. 17(a) is a plan view;

FIG. 17(b) is a front view; FIG. 17(c) is a sectional view in the direction of arrows H-H in FIG. 17(a); and FIG. 17(d) is a rear view.

FIG. 18 is a diagram showing an electronic component substrate 1-5 produced by using a fifth embodiment of the present invention, in which: FIG. 18(a) is a plan view;

FIG. 18(b) is a front view; FIG. 18(c) is a sectional view in the direction of arrows I-I in FIG. 18(a); and FIG. 18(d) is a rear view.

FIG. 20 is a diagram showing an electronic component substrate 1-6, in which: FIG. 20(a) is a plan view;

FIG. 20(b) is a front view; FIG. 20(c) is a sectional view in the direction of arrows J-J in FIG. 20(a); and FIG. 20(d) is a rear view.

FIG. 23 is a diagram showing a pre-set variable resistor 100-6 constructed by using the electronic component substrate 1-6, in which: FIG. 23(a) is a plan view;

FIG. 23(b) is a front view; FIG. 23(c) is a sectional view in the direction of arrows K-K in FIG. 23(a); and FIG. 23(d) is a rear view.

FIG. 25 is a diagram showing an electronic component substrate 1-8 according to an eighth embodiment of the present invention, in which: FIG. 25(a) is a perspective view as seen from above; and FIG. 25(b) is a perspective view as seen from below.

FIG. 26 is a diagram showing the electronic component substrate 1-8, in which: FIG. 26(a) is a plan view; FIG. 26(b) is a front view; FIG. 26(c) is a sectional view in the direction of arrows L-L in FIG. 26(a); FIG. 26(d) is a rear view; and FIG. 26(e) is a sectional view in the direction of arrows M-M in FIG. 26(a).

FIG. 29 is a diagram illustrating the method of producing the electronic component substrate 1-8.

DETAILED DESCRIPTION OF THE INVENTION

Embodiments of the present invention will be described below in detail with reference to the accompanying drawings.

First Embodiment

Figure 1:
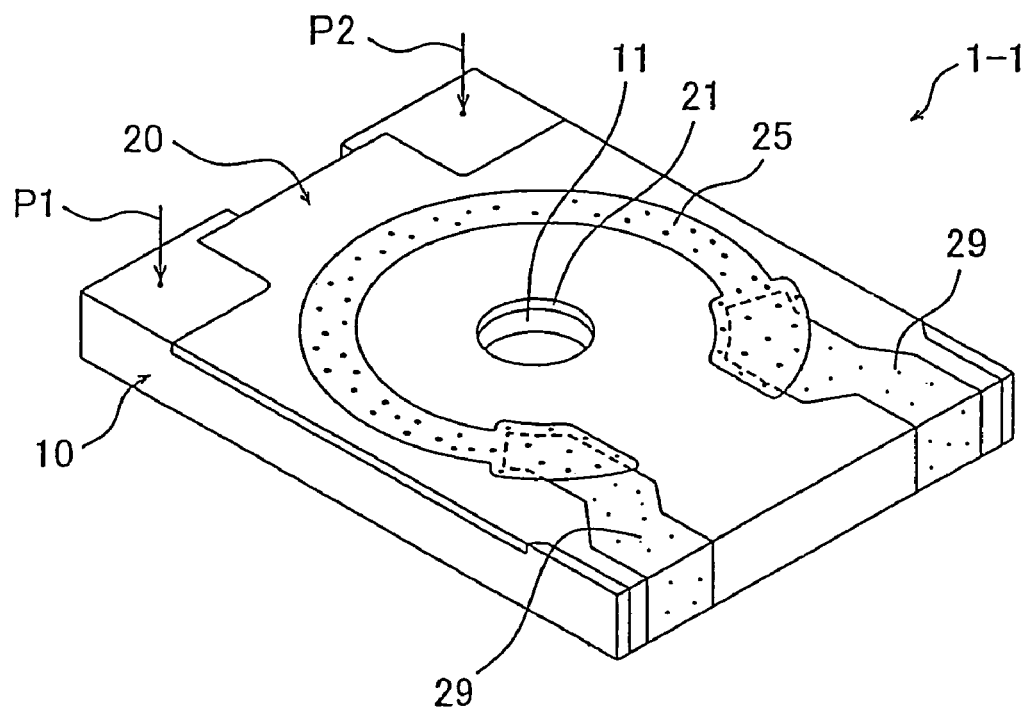
FIG. 1 is a perspective view of an electronic component substrate 1-1 produced by using a first embodiment of the present invention.
Figure 2:
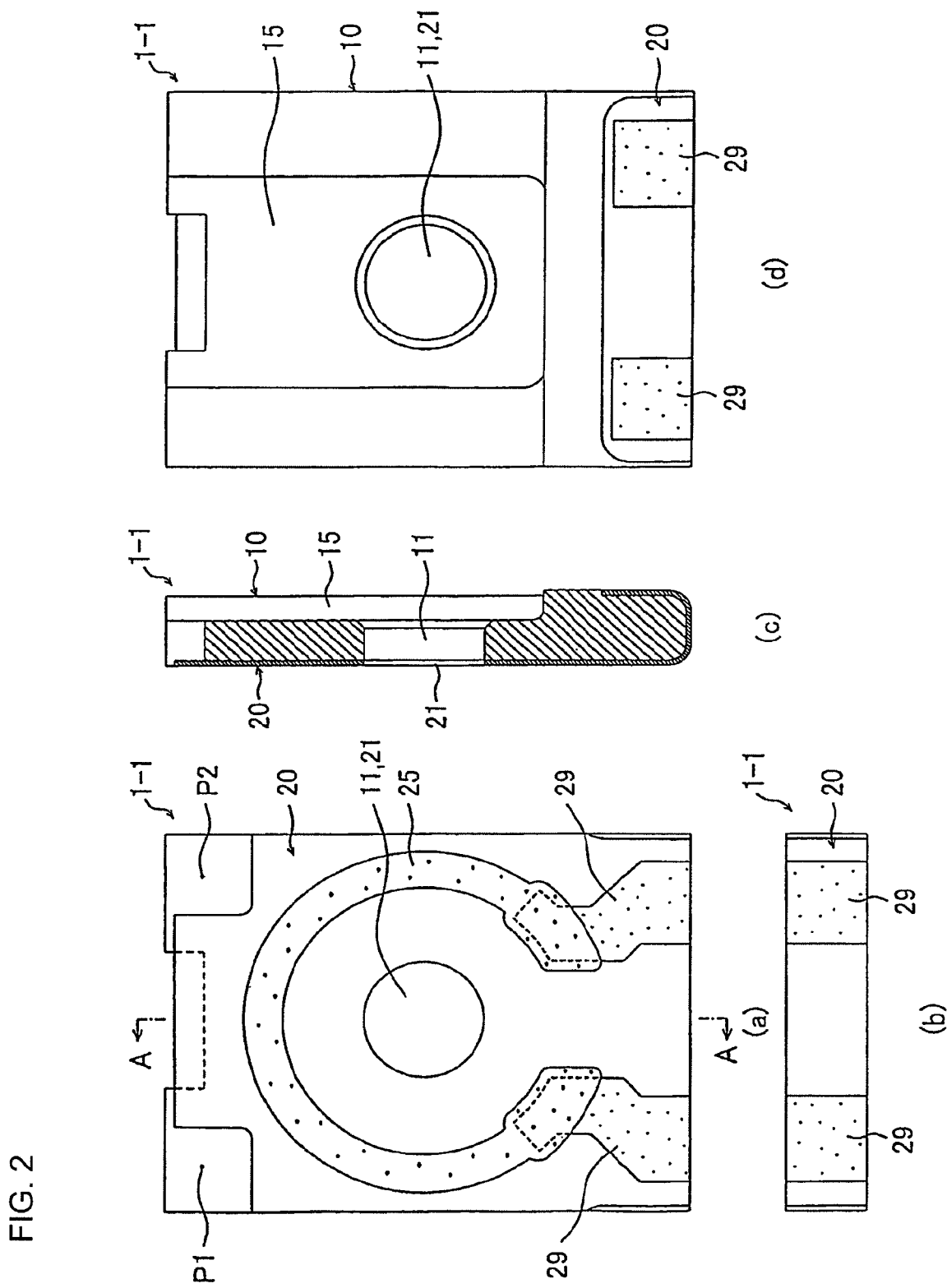

FIGS. 1 and 2 show a substrate 1-1 for an electronic component produced by using a first embodiment of the present invention. FIG. 1 is a perspective view. FIG. 2(a) is a plan view. FIG. 2(b) is a front view. FIG. 2(c) is a sectional view in the direction of arrows A-A in FIG. 2(a). FIG. 2(d) is a rear view. As shown in these figures, the electronic component substrate 1-1 includes an insulating base 10 and a flexible circuit board 20 integrally mounted on the insulating base 10 by insert molding. The electronic component substrate 1-1 will be described below for each constituent part thereof.

The insulating base 10 is an approximately rectangular plate-shaped synthetic resin molded piece provided in the center thereof with a circular through-hole 11. A collector plate accommodating recess 15 with a U-shaped sectional configuration is provided in the center of the lower side of the insulating base 10. The insulating base 10 is made of a thermoplastic synthetic resin, e.g. nylon or polyphenylene sulfide (PPS).

The flexible circuit board 20 is a thermoplastic synthetic resin film (e.g. polyimide film) provided thereon with terminal patterns 29 and a conductor pattern 25 whose surface is slidingly contacted with a slider. That is, the flexible circuit board 20 has a through-hole 21 provided in a central position of the synthetic resin film corresponding to the through-hole 11. The through-hole 21 has the same inner diameter as that of the through-hole 11. A horseshoe-shaped conductor pattern (hereinafter referred to as "resistor pattern" in this embodiment) 25 is provided on the surface of the synthetic resin film around the through-hole 21. Further, terminal patterns 29 are provided at both ends of the resistor pattern 25. The terminal patterns 29 are connected to the resistor pattern 25. An edge portion of the flexible circuit board 20 on the side thereof where the terminal patterns 29 are provided is folded over from the upper side toward the lower side of the insulating base 10 along one outer peripheral side thereof. Consequently, the terminal patterns 29 also extend over along the outer peripheral side of the insulating base 10 toward the lower side thereof.

The resistor pattern 25 is formed from a metal thin film deposited by physical vapor deposition (PVD) or chemical vapor deposition (CVD). Vacuum deposition, sputtering, ion beam deposition, etc. may be used as a method of physical vapor deposition. As a method of chemical vapor deposition, thermal CVD, plasma CVD, photo-assisted CVD, etc. may be used. Examples of materials usable to deposit the resistor pattern 25 are nickel based materials, e.g. nickel-chromium alloy, cermets, e.g. a chromium silicate based compound ($Cr-SiO_2$), and tantalum-based materials, e.g. tantalum nitride. A chromium silicate based compound can easily attain a high specific resistance more than 2000 μΩ·cm and is therefore suitable for achieving a reduction in size of the electronic component substrate 1-1. With this type of metal vapor deposition, the whole resistor pattern 25 can be formed homogeneously with a uniform thickness. Moreover, because the resistor pattern 25 does not contain a resin as in the case of a resistor pattern formed by printing and firing a paste prepared by mixing an electrically conductive powder in a resin, the resistance of the resistor pattern 25 is unlikely to change with temperature. For example, in the case of a resistor pattern formed by printing and firing a carbon paste, the temperature coefficient of resistance is 500 ppm/°C., whereas in the case of a metal thin film formed by using the above-described vacuum deposition, the temperature coefficient of resistance is 100 ppm/°C. This is a favorable temperature characteristic comparable to that in the case of a resistor pattern fired onto a ceramic substrate at high temperature. That is, because the resistor pattern (conductor pattern) 25 is formed from a metal thin film deposited by physical vapor deposition or chemical vapor deposition, it is possible to obtain favorable temperature and humidity characteristics comparable to those in the case of a conductor pattern fired onto a ceramic substrate at high temperature. Moreover, because vapor deposition is used, the production efficiency is better than in the case of firing onto a ceramic substrate.

The terminal patterns 29 are formed from a copper layer and a gold layer successively vapor-deposited over a nichrome primary coat. It should be noted that the terminal patterns 29 may be formed by other means, e.g. printing and firing of an electrically conductive paste, because the terminal patterns 29 have no direct influence on the change in resistance.

That is, the above-described first embodiment discloses an electronic component substrate 1-1 including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10.

In the first embodiment the flexible circuit board 20 is mounted on the insulating base 10 by insert molding in a folded state so that the surface of the flexible circuit board 20 is exposed on the upper and lower sides of the insulating base 10.

Figure 3:
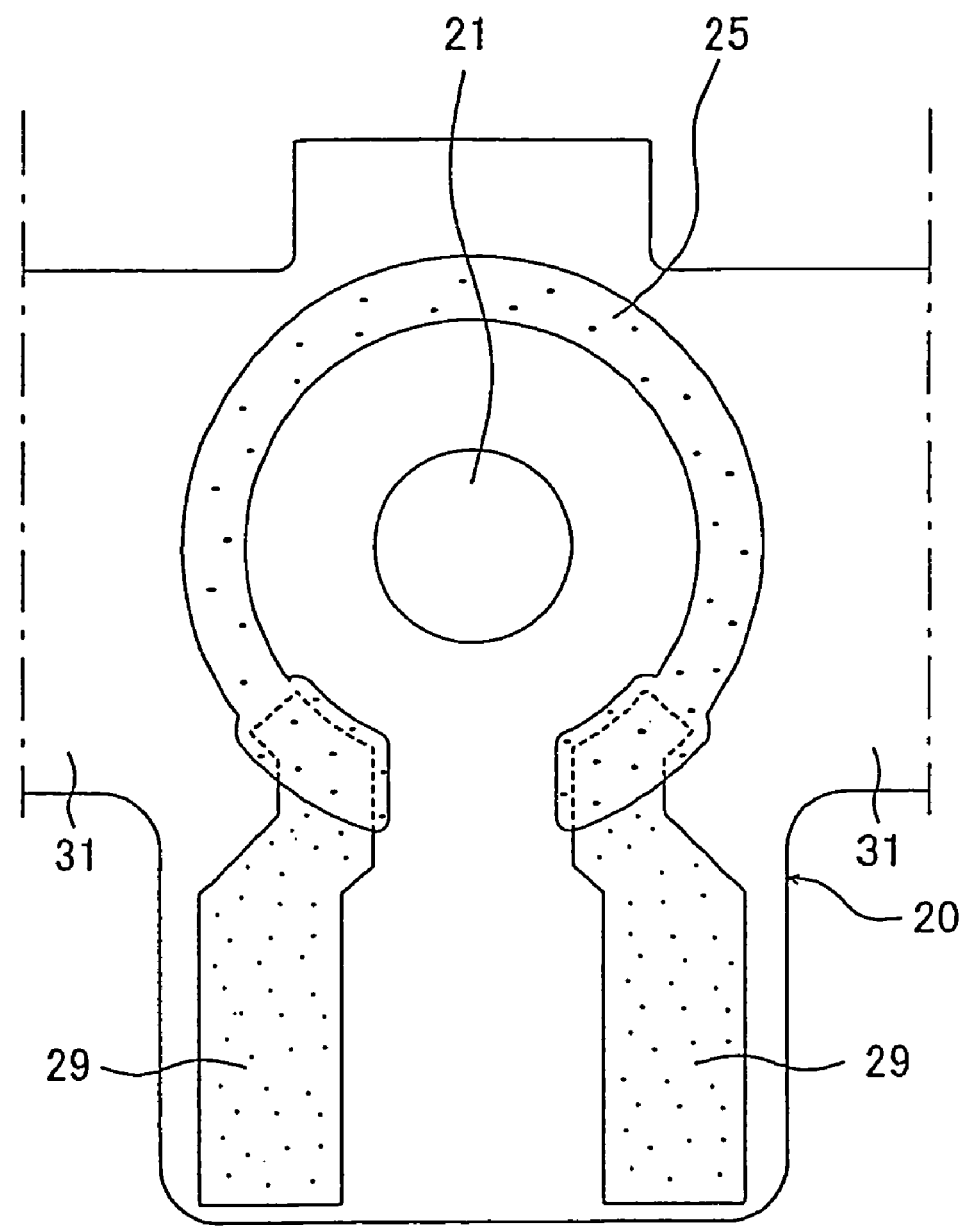
FIG. 3 is a diagram illustrating the method of producing the electronic component substrate 1-1.

Next, a method of producing the electronic component substrate 1-1 will be described. First, a flexible circuit board 20 as shown in FIG. 3 is prepared which has a through-hole 21 and further has a resistor pattern 25 and terminal patterns 29 formed on the surface thereof. The resistor pattern 25 is formed from a metal thin film deposited by physical vapor deposition or chemical vapor deposition. The flexible circuit board 20 has connecting portions 31 projecting from both side edges thereof. A large number of identical flexible circuit boards 20 are connected in parallel through the connecting portions 31.

Figure 4:
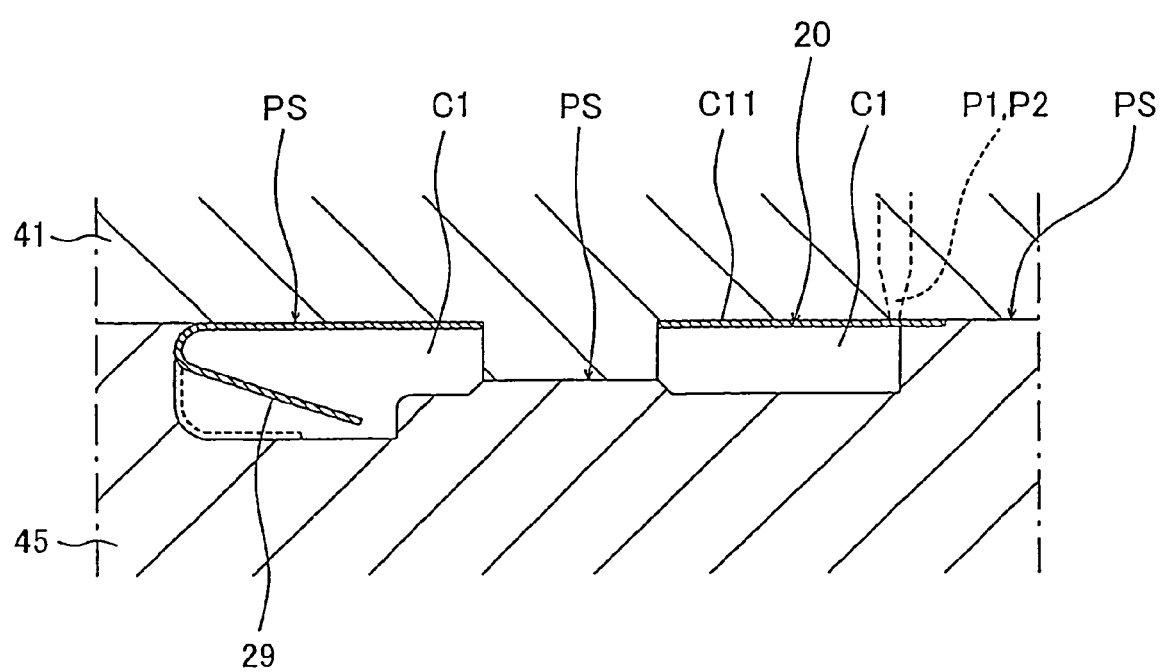
FIG. 4 is a diagram illustrating the method of producing the electronic component substrate 1-1.

Next, as shown in FIG. 4, each flexible circuit board 20 connected through the connecting portions 31 is inserted between two mold members, i.e. a first mold member 41 and a second mold member 45. At this time, a cavity C1 having the same shape as the external shape of the electronic component substrate 1-1 is formed between the first and second mold members 41 and 45. The surface of the flexible circuit board 20 where the resistor pattern 25 is formed is abutted against an inner plane surface C11 of the cavity C1 on the side of the first mold member 41. One end portion of the flexible circuit board 20 where the terminal patterns 29 are provided is folded over toward the second mold member 45. More specifically, the flexible circuit board 20 is accommodated in the cavity C1 between the first and second mold members 41 and 45. At this time, the surface of the flexible circuit board 20 where the resistor pattern 25 is provided is abutted against one inner surface of the cavity C1 (on the side of the first mold member 41), and a portion of the flexible circuit board 20 on the side thereof where the terminal patterns 29 are provided is folded over toward the other inner surface of the cavity C1 (on the side of the second mold member 45). It should be noted that the cavity C1 is formed with a shape corresponding to the external shape of the electronic component substrate 1-1. More specifically, the cavity C1 is in the shape of an approximately rectangular plate of a predetermined thickness that has a projection at the center thereof to form a circular hollow portion serving as a through-hole 11. As shown in FIG. 4, a parting surface PS between projecting portions of the two mold members 41 and 45 for providing the through-hole 11 is positioned within the portion where the through-hole 11 is to be formed.

Then, a heated molten synthetic resin (nylon, polyphenylene sulfide, etc.) is injected from two resin injection ports (shown by arrows P1 and P2 in FIG. 1 and P1 and P2 in FIG. 4) provided on the first mold member 41 side of the cavity C1 to fill the cavity C1 with the molten resin. The injection pressure of the molten resin causes the folded portion of the flexible circuit board 20 to be pressed against the inner peripheral surface of the cavity C1 as shown by the dotted line in FIG. 4. In this state, the injected resin is cooled and solidified. That is, by filling the molten molding resin into the cavity C1, the folded portion of the flexible circuit board 20 is brought into close contact with a cavity wall area extending from the upper surface to the lower surface of the cavity C1 along one outer peripheral side surface thereof. In this state, the molten resin is cooled and solidified. Then, the first and second mold members 41 and 45 are removed, and the connecting portions 31 projecting from both sides of the molded insulating base 10 are cut off. Thus, the electronic component substrate 1-1 shown in FIGS. 1 and 2 is completed. That is, the flexible circuit board 20 is mounted on the approximately rectangular plate-shaped insulating base 10, extending from the upper side to the lower side of the insulating base 10 along one outer peripheral side thereof. It should be noted that a through-hole 11 is provided in the center of the insulating base 10, and a horseshoe-shaped resistor pattern 25 is provided on the flexible circuit board 20 at the outer periphery of the through-hole 11. Further, terminal patterns 29 are provided at both ends of the resistor pattern 25. The terminal patterns 29 further extend to the lower side of the insulating base 10 along one outer peripheral side thereof.

That is, the first embodiment discloses a method of producing an electronic component substrate 1-1 by preparing a flexible circuit board 20 comprising a synthetic resin film provided thereon with a conductor pattern 25, the surface of which is slidingly contacted with a slider, and terminal patterns 29 connected to the conductor pattern 25, and further preparing mold members 41 and 45 having a cavity C1 with a shape that corresponds to the external shape of the electronic component substrate 1-1 to be produced. Then, the flexible circuit board 20 is accommodated in the cavity C1 between the mold members 41 and 45. At this time, the surface of the flexible circuit board 20 where the conductor pattern 25 is provided is abutted against one inner surface C11 of the cavity C1, and a portion of the flexible circuit board 20 on the side thereof where the terminal patterns 29 are provided is folded over toward the other inner surface of the cavity C1. Then, a molten molding resin is filled into the cavity C1, thereby bringing the folded portion of the flexible circuit board 20 into close contact with a cavity wall area extending from the upper surface to the lower surface of the cavity C1 along one outer peripheral side surface thereof. After the filled molding resin has been solidified, the mold members 41 and 45 are removed, whereby the flexible circuit board 20 is mounted on an insulating base 10 made of the molding resin in such a way that a portion of the flexible circuit board 20 where the conductor pattern 25 is provided is exposed on the upper side of the insulating base 10, and a portion of the flexible circuit board 20 on the side thereof where the terminal patterns 29 are provided is exposed in a folded state over an area from the outer peripheral side to the lower side of the insulating base 10.

Thus, it is possible according to this embodiment to easily produce an electronic component substrate 1-1 having a structure in which the resistor pattern 25 is exposed on the upper side of the insulating base 10 and the terminal patterns 29 are exposed over an area extending from one outer peripheral side to the lower side of the insulating base 10, simply by insert-molding the flexible circuit board 20 in the cavity C1 between the first and second mold members 41 and 45. Accordingly, the production cost can be reduced. In addition, the material cost can be reduced in comparison to the ceramic substrate. It is also possible to achieve a reduction in thickness easily and at reduced cost. Further, the electronic component substrate 1-1 can be mass-produced easily by simultaneously forming a large number of sets of resistor patterns 25 on a synthetic resin film, and then simultaneously molding insulating bases 10 together with respective flexible circuit boards 20 provided with respective resistor patterns 25 in each set, followed by cutting the integrally connected flexible circuit boards 20 from each other, thereby enabling each individual discrete product to be obtained. Thus, productivity is improved.

Figure 5:
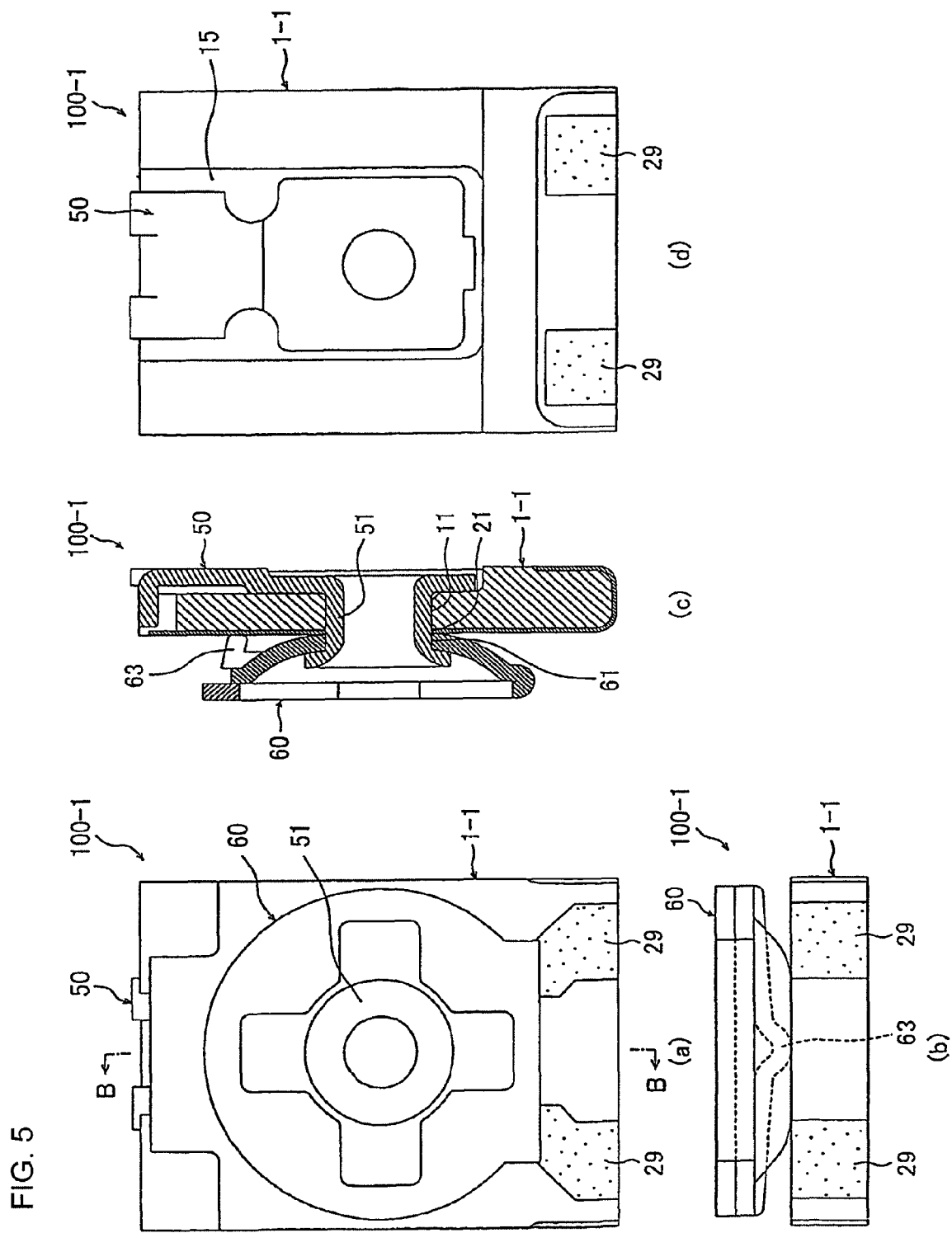

FIG. 5 is a diagram showing a pre-set variable resistor 100-1 constructed by using the electronic component substrate 1-1. FIG. 5(a) is a plan view. FIG. 5(b) is a front view. FIG. 5(c) is a sectional view in the direction of arrows B-B in FIG. 5(a). FIG. 5(d) is a rear view. As shown in these figures, the pre-set variable resistor 100-1 has a slider 60 that is installed on the upper side of the electronic component substrate 1-1. A collector plate 50 is installed on the lower side of the electronic component substrate 1-1. A cylindrical tubular projection 51 provided on the collector plate 50 is inserted through the through-holes 11 and 21. The distal end of the tubular projection 51 extending through the electronic component substrate 1-1 is inserted through a fitting hole 61 provided in the slider 60. Then, the projecting distal end of the tubular projection 51 is caulked, thereby mounting the slider 60 rotatably. The collector plate 50 is accommodated in the collector plate accommodating recess 15 provided on the lower side of the electronic component substrate 1-1. Rotating the slider 60 causes a sliding contact 63 provided on the slider 60 to slide on the surface of the resistor pattern 25 (see FIG. 2), thereby varying the resistance between the terminal patterns 29 and the collector plate 50.

Second Embodiment

Figure 6:
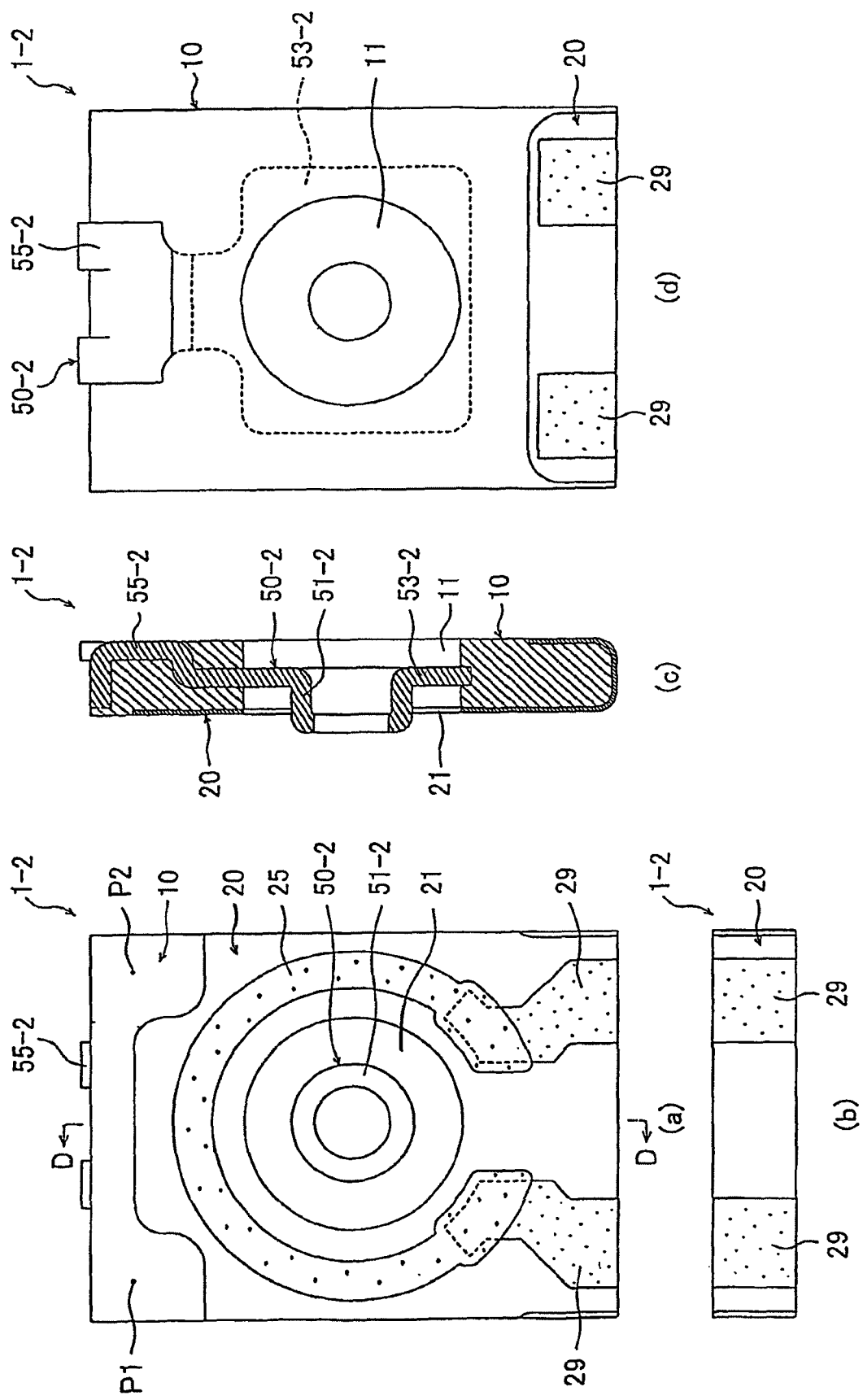

FIG. 6 is a diagram showing an electronic component substrate 1-2 produced by using a second embodiment of the present invention. FIG. 6(a) is a plan view. FIG. 6(b) is a front view. FIG. 6(c) is a sectional view in the direction of arrows D-D in FIG. 6(a). FIG. 6(d) is a rear view. In the electronic component substrate 1-2 shown in these figures, the same portions as those of the electronic component substrate 1-1 are denoted by the same reference numerals, and a detailed description thereof is omitted. In the electronic component substrate 1-2 also, a flexible circuit board 20 is integrally mounted on the upper side of an insulating base 10 by insert molding. A resistor pattern 25 formed on the flexible circuit board 20 is made of a metal thin film deposited by physical vapor deposition or chemical vapor deposition.

The electronic component substrate 1-2 differs from the electronic component substrate 1-1 in that a collector plate 50-2 is also integrally molded in the insulating base 10 of the electronic component substrate 1-1. The collector plate 50-2 has an approximately rectangular base member 53-2 made of a metal sheet. The base member 53-2 is provided in the center thereof with a tubular projection 51-2 projecting from the surface of the electronic component substrate 1-2 where the resistor pattern 25 is provided. The base member 53-2 further has an approximately rectangular connecting portion 55-2 projecting outward from one outer peripheral side of the base member 53-2. The connecting portion 55-2 is bent twice at approximately right angles so as to be exposed on the surface of the electronic component substrate 1-2 opposite to the surface thereof where the resistor pattern 25 is provided. The distal end of the connecting portion 55-2 is trisected, and the central portion of the trisected distal end is bent at approximately right angles toward the surface of the electronic component substrate 1-2 where the resistor pattern 25 is provided. In the electronic component substrate 1-2, the collector plate 50-2 is embedded in the insulating base 10 by insert molding in such a way that the tubular projection 51-2 is positioned in (in the center of) the through-hole 11 of the insulating base 10 (also in the through-hole 21 of the flexible circuit board 20). At this time, the lower side of the connecting portion 55-2 is exposed on the lower side of the insulating base 10, as has been stated above. The tubular projection 51-2 projects from the upper side of the flexible circuit board 20. With this arrangement, the insulating base 10, the flexible circuit board 20 and the collector plate 50-2 can be integrated together at the same time as the insulating base 10 is molded. Accordingly, the production process can be simplified.

That is, the second embodiment discloses an electronic component substrate 1-2 including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. Further, a collector plate 50-2 provided with a tubular projection 51-2 is insert-molded to the insulating base 10 in such a way that the tubular projection 51-2 is positioned in through-holes 11 and 21 respectively provided in the insulating base 10 and the flexible circuit board 20.

Further, the flexible circuit board 20 is mounted on the insulating base 10 by insert molding in a folded state so that the surface of the flexible circuit board 20 is exposed on the upper and lower sides of the insulating base 10.

Next, a method of producing the electronic component substrate 1-2 will be described. First, a flexible circuit board 20 similar to that shown in FIG. 3 is prepared, which has a through-hole 21 and further has a resistor pattern 25 and terminal patterns 29 formed on the surface thereof. The resistor pattern 25 is formed from a metal thin film deposited by physical vapor deposition or chemical vapor deposition. Further, a collector plate 50-2 as shown in FIG. 6 is prepared. As has been stated above, the flexible circuit board 20 has connecting portions 31 projecting from both side edges thereof. A large number of identical flexible circuit boards 20 are connected in parallel through the connecting portions 31. The collector plate 50-2 is also connected to other collector plates 50-2 through the connecting portion 55-2 that is connected at the distal end thereof to a connecting member (not shown). Thus, a large number of identical collector plates 50-2 are connected in parallel through the connecting member.

Figure 8:
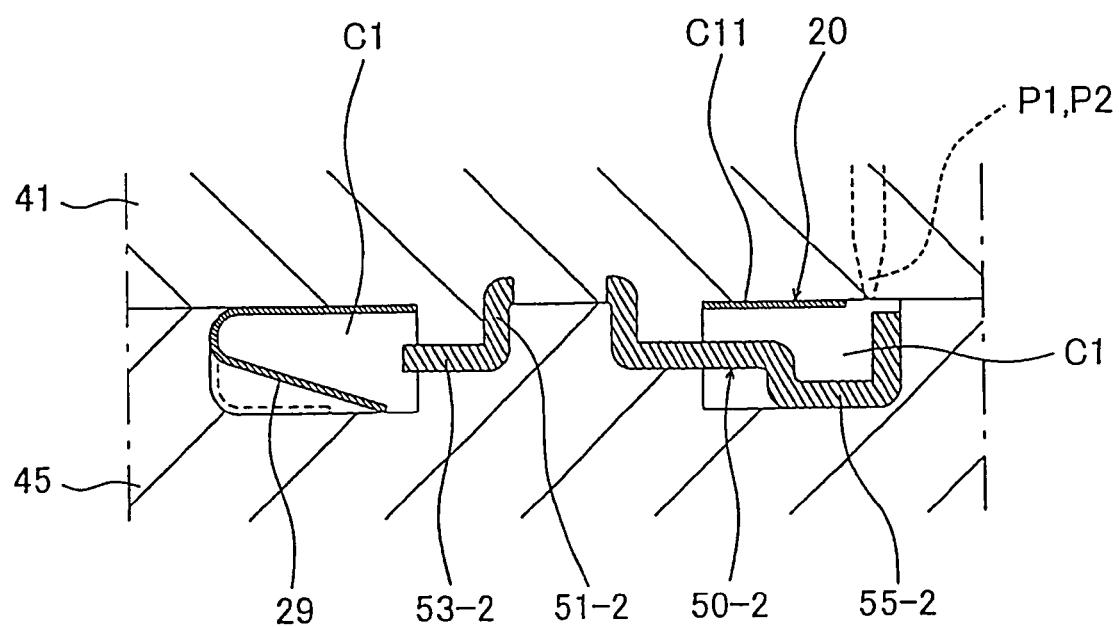
FIG. 8 is a diagram illustrating the method of producing the electronic component substrate 1-2.

Next, as shown in FIG. 8, each flexible circuit board 20 connected through the connecting portions 31 and each collector plate 50-2 connected through the connecting member are inserted between a first mold member 41 and a second mold member 45. At this time, a cavity C1 having the same shape as the external shape of the electronic component substrate 1-2 is formed between the first and second mold members 41 and 45. The surface of the flexible circuit board 20 where the resistor pattern 25 is formed is abutted against an inner plane surface C11 of the cavity C1 on the side of the first mold member 41. One end portion of the flexible circuit board 20 where the terminal patterns 29 are provided is folded over toward the second mold member 45. More specifically, the flexible circuit board 20 is accommodated in the cavity C1 between the first and second mold members 41 and 45. At this time, the surface of the flexible circuit board 20 where the resistor pattern 25 is provided is abutted against one inner surface C11 of the cavity C1, and a portion of the flexible circuit board 20 on the side thereof where the terminal patterns 29 are provided is folded over toward the other inner surface of the cavity C1. Meanwhile, the collector plate 50-2 is clamped at the base member 53-2 thereof between the first and second mold members 41 and 45. At the same time, a projection defined by the two mold members 41 and 45 is inserted into the tubular projection 51-2 of the collector plate 50-2, and the lower side of the connecting portion 55-2 is brought into close contact with the surface of the second mold member 45.

Then, a heated molten synthetic resin (nylon, polyphenylene sulfide, etc.) is injected from two resin injection ports P1 and P2 [see FIG. 6(a)] provided on the first mold member 41 side of the cavity C1 to fill the cavity C1 with the molten resin. The injection pressure of the molten resin causes the folded portion of the flexible circuit board 20 to be pressed against the inner peripheral surface of the cavity C1 as shown by the dotted line in FIG. 8. In this state, the injected resin is cooled and solidified. That is, by filling the molten molding resin into the cavity C1, the folded portion of the flexible circuit board 20 is brought into close contact with a cavity wall area extending from the upper surface to the lower surface of the cavity C1 along one outer peripheral side surface thereof. In this state, the molten resin is cooled and solidified. Then, the first and second mold members 41 and 45 are removed, and the connecting portions 31 projecting from both sides of the molded insulating base 10 and the projecting distal end of the connecting portion 55-2 of the collector plate 50-2 are cut off. Thus, the electronic component substrate 1-2 shown in FIG. 6 is completed. That is, the flexible circuit board 20 is mounted on the approximately rectangular plate-shaped insulating base 10, extending from the upper side to the lower side of the insulating base 10 along one outer peripheral side thereof. It should be noted that a through-hole 11 is provided in the center of the insulating base 10, and a horseshoe-shaped resistor pattern 25 is provided on the flexible circuit board 20 at the outer periphery of the through-hole 11. Further, terminal patterns 29 are provided at both ends of the resistor pattern 25. The terminal patterns 29 further extend to the lower side of the insulating base 10 along one outer peripheral side thereof. Further, the collector plate 50-2 is integrally embedded in the insulating base 10. The tubular projection 51-2 of the collector plate 50-2 extends through the through-hole 11, which is provided in the insulating base 10, and projects beyond the upper side of the insulating base 10. The base member 53-2 is embedded in the insulating base 10. The connecting portion 55-2 is exposed on the lower side of the insulating base 10 (at one outer peripheral side of the insulating base 10 opposite to the terminal patterns 29 exposed on the lower side of the insulating base 10).

That is, the second embodiment discloses a method of producing an electronic component substrate by preparing a flexible circuit board 20 comprising a synthetic resin film provided thereon with a conductor pattern 25, the surface of which is slidingly contacted with a slider, and terminal patterns 29 connected to the conductor pattern 25, and further preparing mold members 41 and 45 having a cavity C1 with a shape that corresponds to the external shape of the electronic component substrate 1-2 to be produced. Then, the flexible circuit board 20 is accommodated in the cavity C1 between the mold members 41 and 45. At this time, the surface of the flexible circuit board 20 where the conductor pattern 25 is provided is abutted against one inner surface C11 of the cavity C1, and a portion of the flexible circuit board 20 on the side thereof where the terminal patterns 29 are provided is folded over toward the other inner surface of the cavity C1. Then, a molten molding resin is filled into the cavity C1, thereby bringing the folded portion of the flexible circuit board 20 into close contact with a cavity wall area extending from the upper surface to the lower surface of the cavity C1 along one outer peripheral side surface thereof. After the filled molding resin has been solidified, the mold members 41 and 45 are removed, whereby the flexible circuit board 20 is mounted on an insulating base 10 made of the molding resin in such a way that a portion of the flexible circuit board 20 where the conductor pattern 25 is provided is exposed on the upper side of the insulating base 10, and a portion of the flexible circuit board 20 on the side thereof where the terminal patterns 29 are provided is exposed in a folded state over an area from the outer peripheral side to the lower side of the insulating base 10. Further, a collector plate 50-2 made of a metal sheet is accommodated in the cavity C1 between the mold members 41 and 45 at the same time as the flexible circuit board 20 is accommodated in the cavity C1, thereby embedding the collector plate 50-2 in the insulating base 10 made of the molding resin.

Thus, it is possible according to this embodiment to easily produce an electronic component substrate 1-2 having a structure in which the resistor pattern 25 is exposed on the upper side of the insulating base 10 and the terminal patterns 29 are exposed over an area extending from one outer peripheral side to the lower side of the insulating base 10 and further the collector plate 50-2 is mounted, simply by insert-molding the flexible circuit board 20 and the collector plate 50-2 in the cavity C1 between the first and second mold members 41 and 45. Accordingly, productivity is improved, and the production cost can be reduced. In addition, the material cost can be reduced in comparison to the ceramic substrate. It is also possible to achieve a reduction in thickness easily and at reduced cost.

Figure 7:
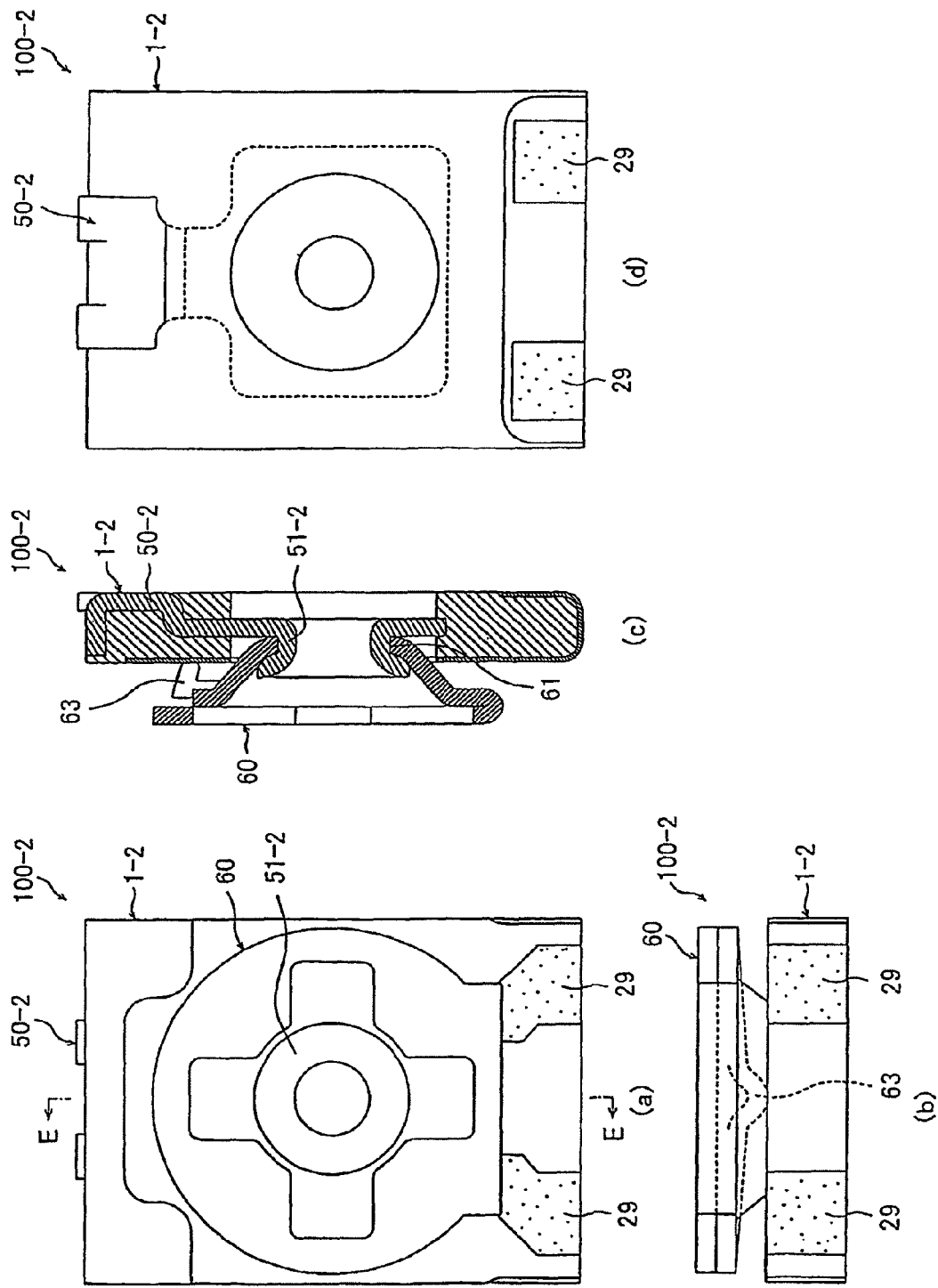

FIG. 7 is a diagram showing a pre-set variable resistor 100-2 constructed by using the electronic component substrate 1-2. FIG. 7(a) is a plan view. FIG. 7(b) is a front view. FIG. 7(c) is a sectional view in the direction of arrows E-E in FIG. 7(a). FIG. 7(d) is a rear view. As shown in these figures, the pre-set variable resistor 100-2 has a slider 60 rotatably mounted on the upper side of the electronic component substrate 1-2 by inserting the tubular projection 51-2 provided on the collector plate 50-2 through a fitting hole 61 provided in the slider 60 and caulking the distal end of the tubular projection 51-2. Rotating the slider 60 causes a sliding contact 63 provided on the slider 60 to slide on the surface of the resistor pattern 25 (see FIG. 6), thereby varying the resistance between the terminal patterns 29 and the collector plate 50-2.

Third Embodiment

Figure 10:
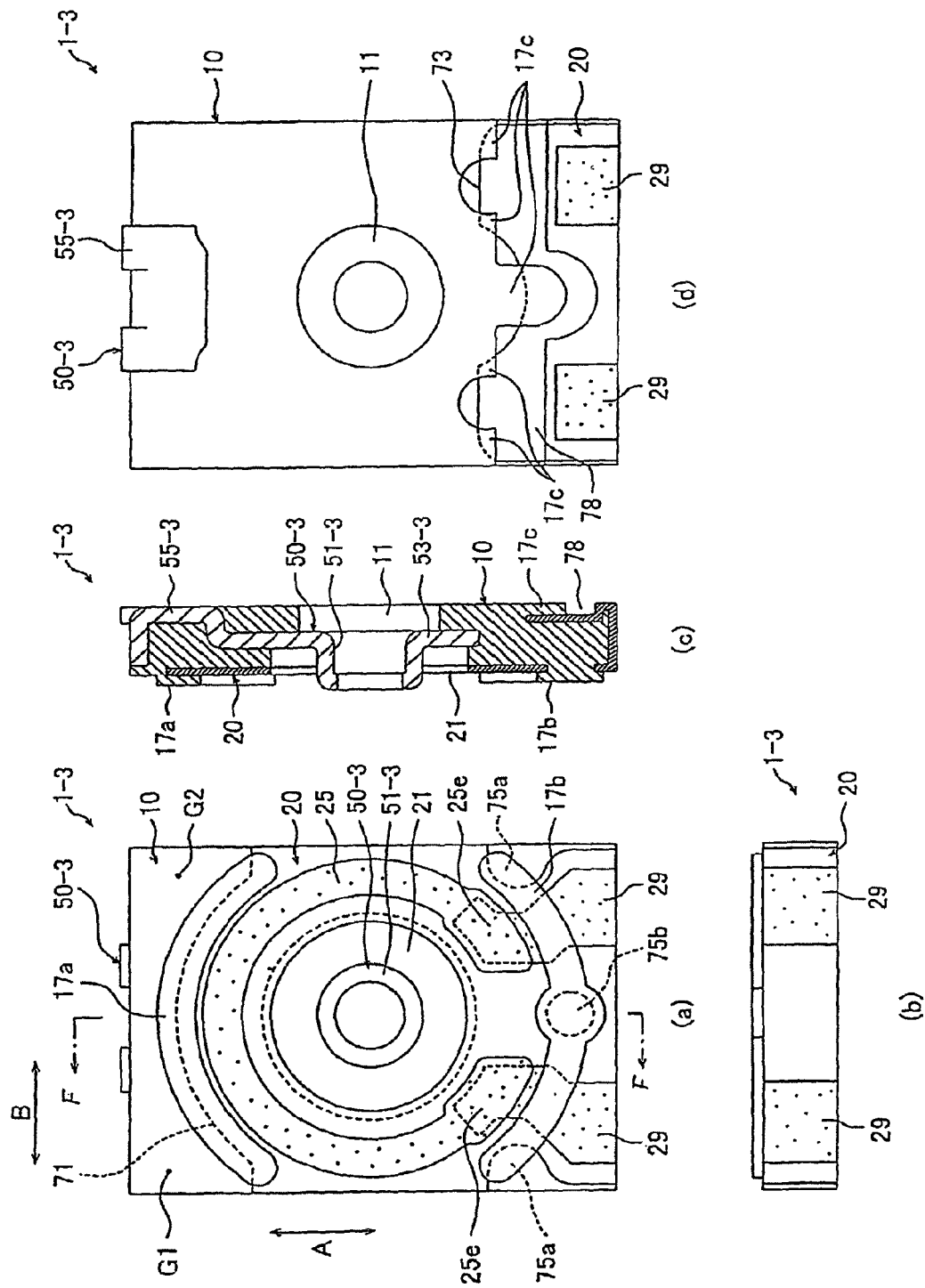

FIGS. 9 and 10 show an electronic component substrate 1-3 produced by using a third embodiment of the present invention. FIG. 9(a) is a perspective view as seen from above. FIG. 9(b) is a perspective view as seen from below. FIG. 10(a) is a plan view. FIG. 10(b) is a front view. FIG. 10(c) is a sectional view in the direction of arrows F-F in FIG. 10(a). FIG. 10(d) is a rear view. In the electronic component substrate 1-3 shown in these figures, the same portions as those of the electronic component substrates 1-1 and 1-2 are denoted by the same reference numerals, and a detailed description thereof is omitted. In the electronic component substrate 1-3 also, a flexible circuit board 20 is integrally mounted on the upper side of an insulating base 10 by insert molding. A resistor pattern 25 formed on the flexible circuit board 20 is made of a metal thin film deposited by physical vapor deposition or chemical vapor deposition. It should be noted that the constituent material of each member constituting the electronic component substrate 1-3 is the same as that of each corresponding member in the first and second embodiments, and the method of producing the electronic component substrate 1-3 is also the same as in the first and second embodiments.

In this embodiment also, the insulating base 10 is an approximately rectangular plate-shaped synthetic resin molded piece, and a collector plate 50-3 is integrally mounted in the insulating base 10 by insert molding in the same way as in the electronic component substrate 1-2. The collector plate 50-3 also has the same configuration as that of the collector plate 50-2. That is, the collector plate 50-3 has an approximately rectangular base member 53-3 made of a metal sheet. The base member 53-3 is provided in the center thereof with a tubular projection 51-3 projecting from the surface of the electronic component substrate 1-3 where the resistor pattern 25 is provided. The base member 53-3 further has an approximately rectangular connecting portion 55-3 projecting outward from one outer peripheral side of the base member 53-3. The connecting portion 55-3 is bent twice at approximately right angles so as to be exposed on the surface of the electronic component substrate 1-3 opposite to the surface thereof where the resistor pattern 25 is provided. The distal end of the connecting portion 55-3 is trisected, and the central portion of the trisected distal end is bent at approximately right angles toward the surface of the electronic component substrate 1-3 where the resistor pattern 25 is provided. In the electronic component substrate 1-3 also, the collector plate 50-3 is embedded in the insulating base 10 by insert molding in such a way that the tubular projection 51-3 is positioned in (in the center of) the through-hole 11 of the insulating base 10 (also in the through-hole 21 of the flexible circuit board 20). At this time, the lower side of the connecting portion 55-3 is exposed on the lower side of the insulating base 10, as has been stated above. The inner diameters of the through-holes 11 and 21 are larger than the outer diameter of the tubular projection 51-3. The tubular projection 51-3 projects from the upper side of the flexible circuit board 20. With this arrangement, the insulating base 10, the flexible circuit board 20 and the collector plate 50-3 can be integrated together at the same time as the insulating base 10 is molded, in the same way as in the second embodiment. Accordingly, the production process can be simplified.

Figure 11:
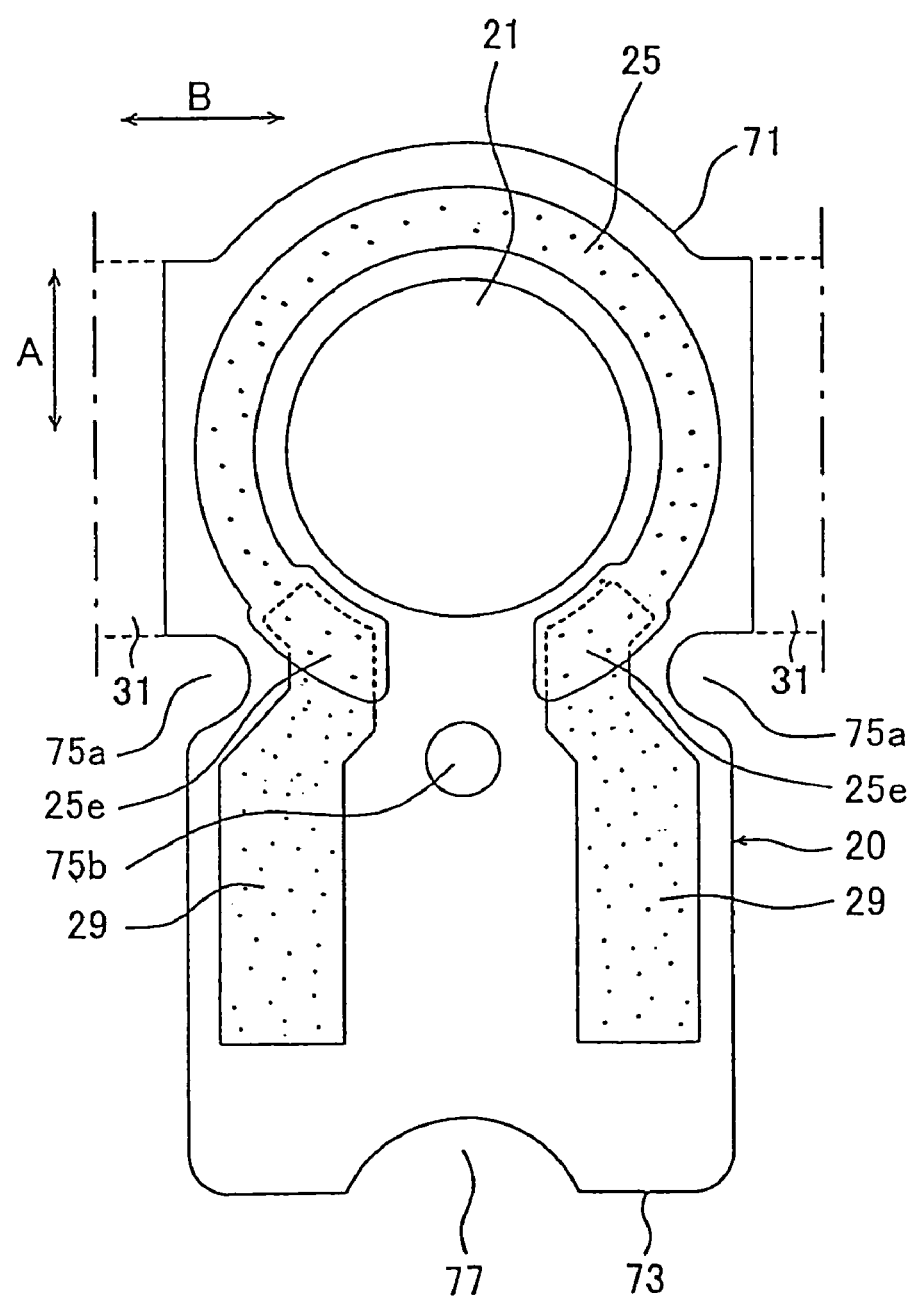
FIG. 11 is a diagram illustrating the method of producing the electronic component substrate 1-3.

As shown in FIG. 11, the flexible circuit board 20 is a thermoplastic synthetic resin film having an approximately rectangular configuration (in which the width is approximately equal to the width of the insulating base 10, and the length is longer than the length of the insulating base 10 by a predetermined dimension). The center of the synthetic resin film is provided with a through-hole 21 at a position corresponding to the through-hole 11. The through-hole 21 has the same inner diameter as that of the through-hole 11. Further, a horseshoe-shaped conductor pattern (hereinafter referred to as "resistor pattern" in this embodiment) 25 is provided on the surface of the synthetic resin film at the outer periphery of the through-hole 21. Further, approximately rectangular terminal patterns 29 extending along the longitudinal direction (A) are provided on the surface of the synthetic resin film in electrical connection with both ends 25*e* of the resistor pattern 25. An edge portion of the flexible circuit board 20 on the side thereof where the terminal patterns 29 are provided is folded over from the upper side toward the lower side of the insulating base 10 along one outer peripheral side thereof. Consequently, the flexible circuit board 20 is mounted on the insulating base 10 in a folded state so that the surface of the flexible circuit board 20 is exposed on the upper side, outer peripheral side and lower side of the insulating base 10. Accordingly, the resistor pattern 25 is exposed on the upper side of the insulating base 10, and the terminal patterns 29 are exposed over an area extending from the upper side to the lower side of the insulating base 10 along the outer peripheral side thereof.

In the electronic component substrate 1-3, the insulating base 10 is integrally provided with retaining portions 17*a*, 17*b* and 17*c* formed of an insert-molding resin. The retaining portion 17*a* has an arcuate configuration to cover an end edge 71 of the flexible circuit board 20 outside the resistor pattern 25, which is one end of the flexible circuit board 20 (on the side thereof where the resistor pattern 25 is provided) in the longitudinal direction (A) (it should be noted that the retaining portion 17*a* does not cover the resistor pattern 25). The retaining portion 17*b* is provided near the outer peripheries of the ends 25*e* of the resistor pattern 25 on the flexible circuit board 20. The retaining portion 17*b* has an arcuate configuration to cover the two terminal patterns 29. The retaining portion 17*c* is disposed on the lower side of the insulating base 10 and has a flat plate-shaped configuration flush with the lower side of the insulating base 10 to cover an end edge 73 of the flexible circuit board 20 on the side thereof where the terminal patterns 29 are provided. With the retaining portions 17*a*, 17*b* and 17*c*, the flexible circuit board 20 is firmly secured to the insulating base 10.

The end edge 71 of the flexible circuit board 20 is formed in an arcuate configuration in conformity to the arcuate shape of the resistor pattern 25. The retaining portion 17*a* is also formed in an arcuate configuration in conformity to the arcuate shape of the resistor pattern 25.

The flexible circuit board 20 is provided with a pair of resin insertion portions 75*a* formed by concavely cutting two longitudinally extending sides of the flexible circuit board 20 [i.e. both ends in the lateral direction (B) of the flexible circuit board 20] at the outer peripheries of the joints of the resistor pattern 25 and the terminal patterns 29. In addition, a resin insertion portion 75*b* defined by a through-hole is provided between the two terminal patterns 29. The retaining portion 17*b* is molded over the resin insertion portions 75*a* and 75*b* and in an arcuate configuration in conformity to the arcuate shape of the resistor pattern 25. The retaining portion 17*b* is connected to the molding resin constituting the insulating base 10 at the lower side thereof through the resin insertion portions 75*a* and 75*b*.

The end edge 73 of the flexible circuit board 20, which is the other end (on the side where the terminal patterns 29 are provided) in the longitudinal direction (A) that is folded to extend along the lower side of the insulating base 10, extends approximately in a straight-line form and has an arcuate recess 77 (see FIG. 11) provided in the center thereof. The retaining portion 17*c* is molded over the end edge 73 so as to retain the end edge 73 at a plurality of positions (five positions). A portion of the surface of the flexible circuit board 20 near the end edge 73 is recessed as far as the bottom of a recess 78 recessed toward the inner side of the insulating base 10 from a position immediately behind the edge along which the flexible circuit board 20 is folded over toward the lower side of the insulating base 10 (i.e. from a portion of the lower side of insulating base 10 closer to the outer peripheral side thereof). This is done because the surface of the flexible circuit board 20 needs to be lowered by an amount corresponding to the thickness of the retaining portion 17*c* in order to make the surface of the retaining portion 17*c* flush with the exposed surfaces of the terminal patterns 29.

That is, the third embodiment is an electronic component substrate 1-3 including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. Further, a collector plate 50-3 provided with a tubular projection 51-3 is insert-molded to the insulating base 10 in such a way that the tubular projection 51-3 is positioned in through-holes 11 and 21 respectively provided in the insulating base 10 and the flexible circuit board 20. Further, the insulating base 10 is provided with retaining portions 17*a*, 17*b* and 17*c* for firmly securing the flexible circuit board 20 to the insulating base 10.

In the third embodiment, the collector plate 50-3 provided with the tubular projection 51-3 is insert-molded to the insulating base 10, by way of example. However, it is also possible to construct an electronic component substrate having the same structure as in the third embodiment except that the collector plate 50-3 is not insert-molded to the insulating base 10.

This electronic component substrate includes an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. Further, the insulating base 10 is provided with retaining portions 17*a*, 17*b* and 17*c* for firmly securing the flexible circuit board 20 to the insulating base 10.

Next, a method of producing the electronic component substrate 1-3 will be described. First, as shown in FIG. 11, a flexible circuit board 20 is prepared which has a through-hole 21 and resin insertion portions 75a and 75b and further has a resistor pattern 25 and terminal patterns 29 formed on the surface thereof. The resistor pattern 25 is formed from a metal thin film deposited by physical vapor deposition or chemical vapor deposition. In addition, a collector plate 50-3 as shown in FIG. 10 is prepared. The flexible circuit board 20 has connecting portions 31 projecting from both side edges of a portion where the resistor pattern 25 is provided. A large number of identical flexible circuit boards 20 (not shown) are connected in parallel through the connecting portions 31. The collector plate 50-3 is also connected to other collector plates 50-3 through the connecting portion 55-3 that is connected at the distal end thereof to a connecting member (not shown). Thus, a large number of identical collector plates 50-3 are connected in parallel through the connecting member.

Figure 12:
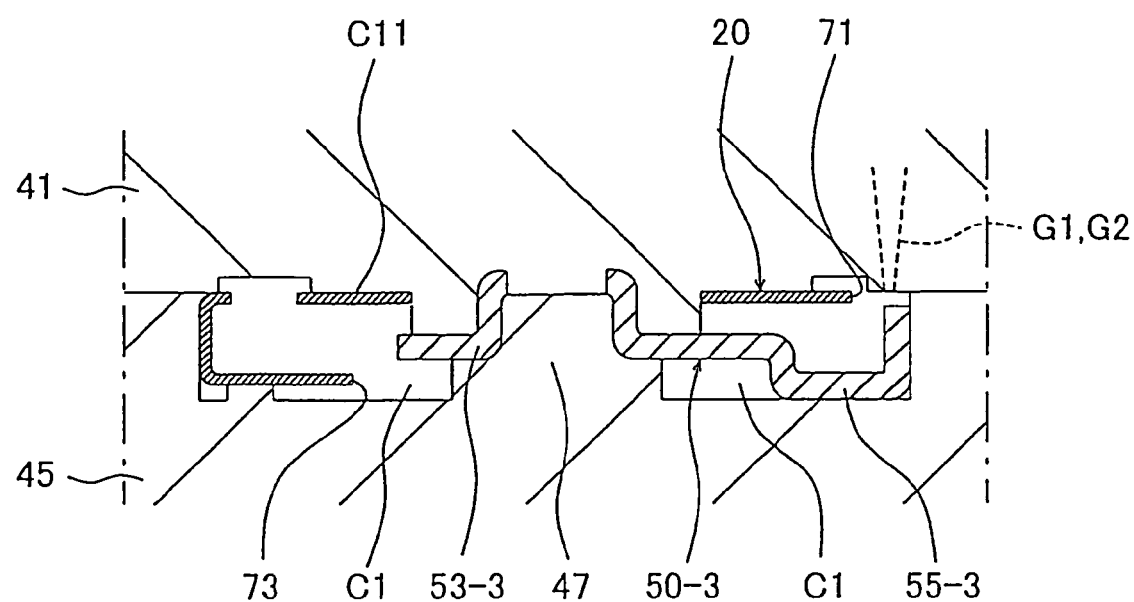
FIG. 12 is a diagram illustrating the method of producing the electronic component substrate 1-3.

Next, as shown in FIG. 12, each flexible circuit board 20 connected through the connecting portions 31 and each collector plate 50-3 connected through the connecting member is inserted between a first mold member 41 and a second mold member 45. At this time, a cavity C1 having the same shape as the external shape of the electronic component substrate 1-3 is formed between the first and second mold members 41 and 45. The surface of the flexible circuit board 20 where the resistor pattern 25 is formed is abutted against an inner plane surface C11 of the cavity C1 on the side of the first mold member 41. Moreover, the portion of the flexible circuit board 20 closer to one end edge 73 where the terminal patterns 29 are provided is folded over toward the second mold member 45. More specifically, the flexible circuit board 20 is accommodated in the cavity C1 between the first and second mold members 41 and 45. At this time, the surface of the flexible circuit board 20 where the resistor pattern 25 is provided is abutted against one inner surface of the cavity C1 (on the first mold member side), and the portion of the flexible circuit board 20 on the side thereof where the terminal patterns 29 are provided is folded over toward the other inner surface of the cavity C1 (on the second mold member side). Meanwhile, the collector plate 50-3 is clamped at the base member 53-3 thereof between the first and second mold members 41 and 45, and the lower side of the connecting portion 55-3 is brought into close contact with the surface of the second mold member 45. It should be noted that the reason why the recess 77 (see FIG. 11) is provided on the end edge 73 of the flexible circuit board 20 is to prevent the flexible circuit board 20 from contacting a projection 47, which is provided on the second mold member 45 to form the through-hole 11, when the portion of the flexible circuit board 20 closer to the end edge 73 is folded over toward the second mold member 45.

Then, a heated molten synthetic resin is injected from two resin injection ports [shown by arrows G1 and G2 in FIG. 9(a) and G1 and G2 in FIG. 12) provided on the mold member 41 side to fill the cavity C1 with the molten resin. The injection pressure and heat of the molten resin cause the flexible circuit board 20 to be pressed against the inner peripheral surface of the cavity C1 and deformed into the inner peripheral surface configuration. In this state, the injected resin is cooled and solidified. That is, by filling the molten molding resin into the cavity C1, the folded portion of the flexible circuit board 20 is brought into close contact with a cavity wall area extending from the upper surface to the lower surface of the cavity C1 along one outer peripheral side surface thereof. In this state, the molten resin is cooled and solidified. Then, the first and second mold members 41 and 45 are removed, and the connecting portions 31 projecting from both sides of the molded insulating base 10 and the projecting distal end of the connecting portion 55-3 of the collector plate 50-3 are cut off. Thus, the electronic component substrate 1-3 shown in FIGS. 9 and 10 is completed.

It should be noted that the reason why the end edge 73 and its vicinities are retained discontinuously at a plurality of positions with the retaining portion 17c as stated above is to abut a part of the end edge 73 against the surface of the second mold member 45 to thereby hold the end edge 73 so that this portion will not be deformed by being pushed down to the surface of the second mold member 45 by the injection pressure of the molten molding resin. In other words, the end edge 73 and its vicinities exposed on the lower side of the insulating base 10 without being covered with the retaining portion 17c are formed as the result of holding the end edge 73 and its vicinities by the second mold member 45.

Thus, it is possible according to this embodiment to easily produce an electronic component substrate 1-3 having a structure in which the resistor pattern 25 is exposed on the upper side of the insulating base 10 and the terminal patterns 29 are exposed over an area extending from one outer peripheral side to the lower side of the insulating base 10 and further the collector plate 50-3 is mounted, simply by insert-molding the flexible circuit board 20 and the collector plate 50-3 in the cavity C1 between the first and second mold members 41 and 45. Accordingly, productivity is improved, and the production cost can be reduced. In addition, the material cost can be reduced in comparison to the ceramic substrate. It is also possible to achieve a reduction in thickness easily and at reduced cost.

With the electronic component substrate 1-3, the portion of the flexible circuit board 20 provided on the upper side of the insulating base 10 and the portion of the flexible circuit board 20 provided on the lower side of the insulating base 10 are provided with the retaining portions 17a to 17c, respectively, for firmly securing the flexible circuit board 20 to the insulating base 10. Therefore, even if the flexible circuit board 20 and the insulating base 10 are made of a combination of materials that are not easily fixed to each other only with the heat and pressure applied during insert molding, the flexible circuit board 20 can be easily and firmly secured to the insulating base 10 without the occurrence of such a problem that the flexible circuit board 20 separates from the surface of the insulating base 10. It should be noted that in this embodiment the retaining portions 17a to 17c are provided for the resistor pattern-side end edge 71 of the flexible circuit board 20 provided on the upper side of the insulating base 10 and for the portions near the outer peripheries of the ends 25e of the resistor pattern 25 and further for the terminal pattern-side end edge 73 provided on the lower side of the insulating base 10. However, in a case where the flexible circuit board 20 is fixed to the insulating base 10 relatively firmly, it may be only necessary to provide a retaining portion for any one of the three positions. In such a case, it is preferable that the retaining portion 17c be provided for the end edge 73 of the flexible circuit board 20, which is closer to the terminal patterns 29, because the portion of the flexible circuit board 20 folded over toward the lower side of the insulating base 10 is subjected to the strongest stress acting to return it to the original shape and hence easily separable.

With the electronic component substrate 1-3 produced as stated above, the tubular projection 51-3 is passed through a fitting hole 61 of a slider 60 similar to that shown in FIG. 7, and the distal end of the tubular projection 51-3 is caulked, thereby mounting the slider 60 rotatably. Thus, a pre-set variable resistor is constructed.

Fourth Embodiment

Figure 13:
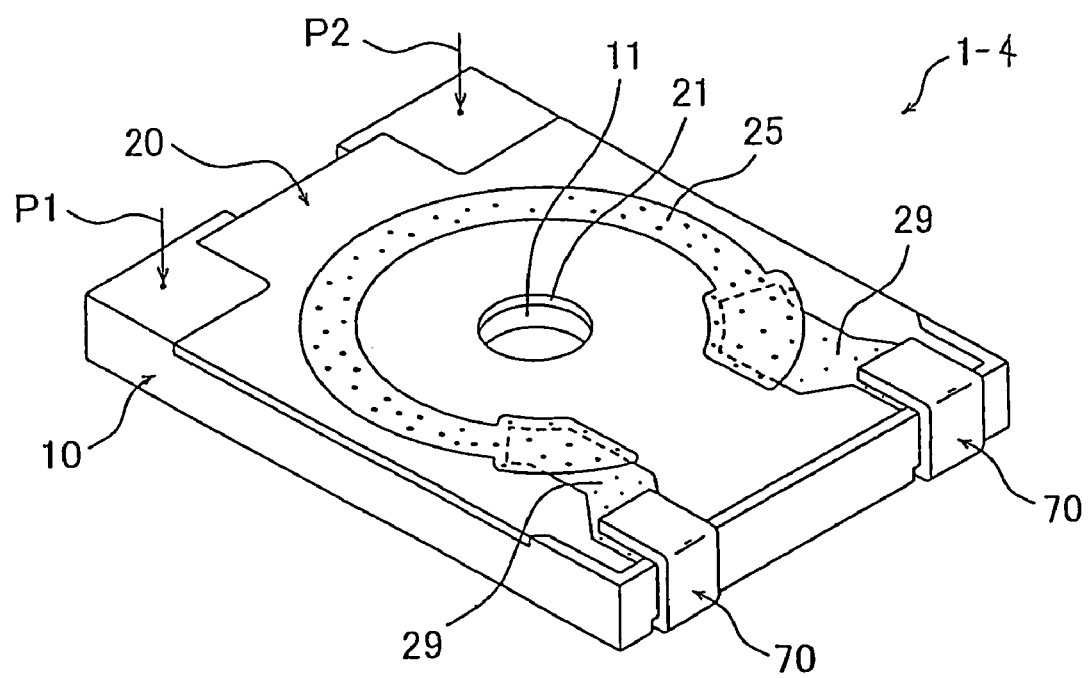
FIG. 13 is a perspective view showing an electronic component substrate 1-4 produced by using a fourth embodiment of the present invention.
Figure 14:
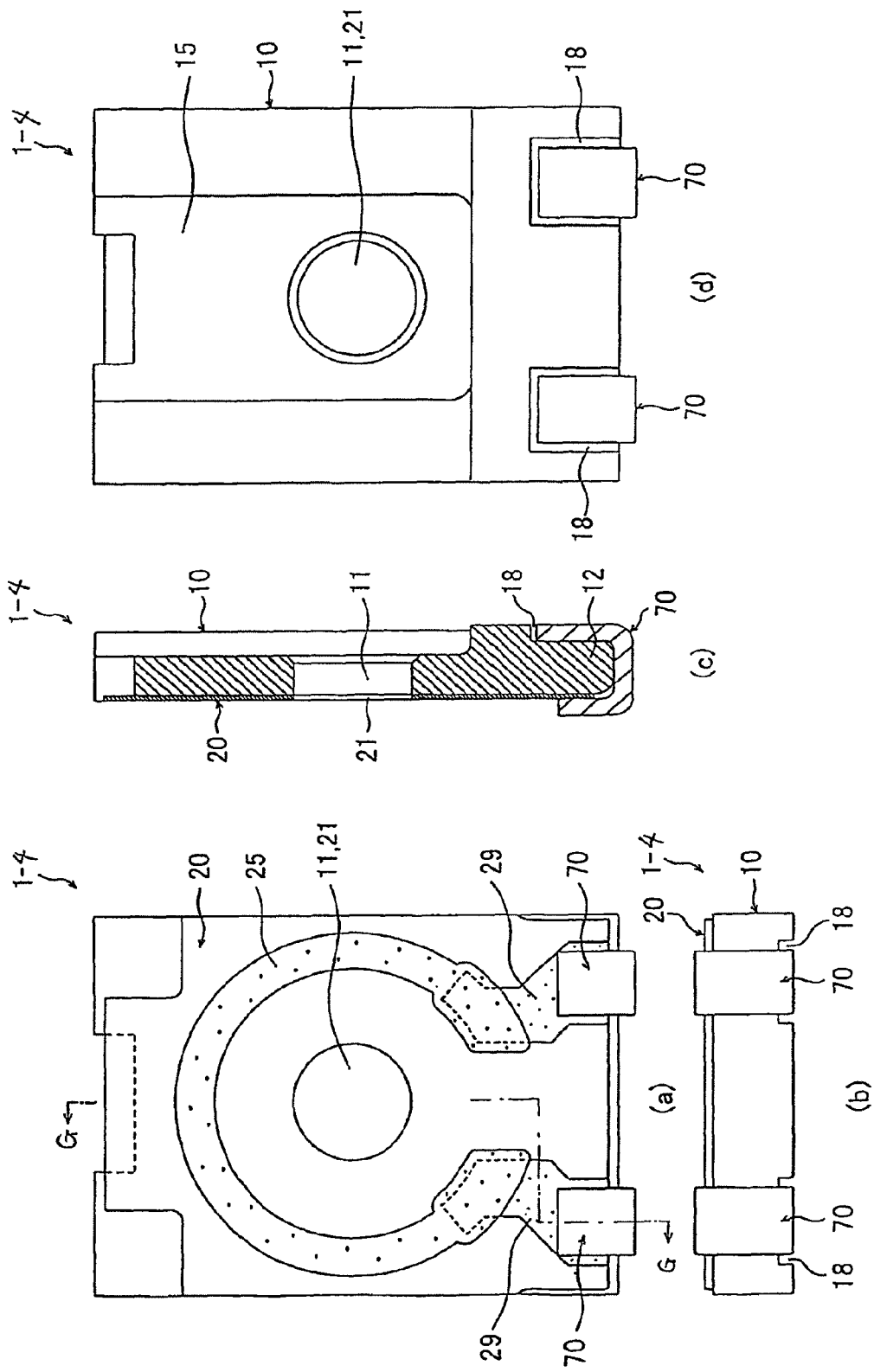

FIGS. 13 and 14 are diagrams showing an electronic component substrate 1-4 produced by using a fourth embodiment of the present invention. FIG. 13 is a perspective view. FIG. 14(a) is a plan view. FIG. 14(b) is a front view. FIG. 14(c) is a sectional view in the direction of arrows G-G in FIG. 14(a). FIG. 14(d) is a rear view. As shown in these figures, the electronic component substrate 1-4 includes an insulating base 10 and a flexible circuit board 20 integrally mounted on the insulating base 10 by insert molding. In addition, terminal plates 70 are mounted on an end portion of the insulating base 10 in electrical connection with terminal patterns 29 provided on the flexible circuit board 20. The electronic component substrate 1-4 will be described below for each constituent part thereof.

The insulating base 10 is an approximately rectangular plate-shaped synthetic resin molded piece provided in the center thereof with a circular through-hole 11. A collector plate accommodating recess 15 with a U-shaped sectional configuration is provided in the center of the lower side of the insulating base 10. Further, terminal plate accommodating recesses 18 with a size and configuration suitable for accommodating the terminal plates 70 are provided on the lower side of the insulating base 10 near one end edge thereof. The insulating base 10 is made of a thermoplastic synthetic resin, e.g. nylon or polyphenylene sulfide (PPS).

The flexible circuit board 20 is a thermoplastic synthetic resin film (e.g. polyimide film) provided thereon with terminal patterns 29 and a conductor pattern 25 whose surface is slidingly contacted with a slider. That is, the flexible circuit board 20 has a through-hole 21 provided in a central position of the synthetic resin film corresponding to the through-hole 11. The through-hole 21 has the same inner diameter as that of the through-hole 11. A horseshoe-shaped conductor pattern (hereinafter referred to as "resistor pattern" in this embodiment) 25 is provided on the surface of the synthetic resin film around the through-hole 21. Further, terminal patterns 29 are provided at both ends of the resistor pattern 25. The terminal patterns 29 are connected to the resistor pattern 25.

The resistor pattern 25 is formed from a metal thin film deposited by physical vapor deposition (PVD) or chemical vapor deposition (CVD). Vacuum deposition, sputtering, ion beam deposition, etc. may be used as a method of physical vapor deposition. As a method of chemical vapor deposition, thermal CVD, plasma CVD, photo-assisted CVD, etc. may be used. Examples of materials usable to deposit the resistor pattern 25 are nickel based materials, e.g. nickel-chromium alloy, cermets, e.g. a chromium silicate based compound (Cr—SiO$_2$), and tantalum-based materials, e.g. tantalum nitride. A chromium silicate based compound can easily attain a high specific resistance more than 2000 μΩ·cm and is therefore suitable for achieving a reduction in size of the electronic component substrate 1-4.

Incidentally, it is also possible to use a resistor pattern made of a resistor paste, e.g. carbon paste, as a resistor pattern 25 in the present invention. However, in this embodiment, a resistor pattern 25 formed by metal vapor deposition is used because the electronic component substrate 1-4 is a substrate for a pre-set variable resistor. The reason for this is as follows. A pre-set variable resistor is usually mounted on another circuit board or the like before a resistance is set by rotating the slider. Once a resistance has been set, the set resistance is not changed but maintained as it is during use. Accordingly, it is necessary for this type of pre-set variable resistor that the set resistance should not easily be affected by temperature or humidity. When a resistor pattern made of a resistor paste is used, however, the set resistance is likely to change with a change in temperature or humidity because the resistor paste is a mixture of a resin and an electrically conductive powder and the resin contained in the resistor pattern is easily affected by heat and humidity.

With the resistor pattern 25 formed by the above-described metal vapor deposition, the whole resistor pattern 25 can be formed homogeneously with a uniform thickness. Moreover, because the resistor pattern 25 does not contain a resin as in the case of a resistor pattern formed by printing and firing a paste prepared by mixing an electrically conductive powder in a resin, the resistance is unlikely to change with temperature. For example, in the case of a resistor pattern formed by printing and firing a carbon paste, the temperature coefficient of resistance is 500 ppm/° C., whereas in the case of a metal thin film formed by using the above-described vacuum deposition, the temperature coefficient of resistance is 100 ppm/° C. It should be noted that the temperature coefficient of resistance of the metal thin film is a favorable temperature characteristic comparable to that in the case of a resistor pattern fired onto a ceramic substrate at high temperature. For the reasons stated above, the resistor pattern 25 formed by metal vapor deposition is used in this embodiment.

The terminal patterns 29 are formed from a copper layer and a gold layer successively vapor-deposited over a nichrome primary coat. It should be noted that the terminal patterns 29 may be formed by other means, e.g. printing and firing of an electrically conductive paste, because the terminal patterns 29 have no direct influence on the change in resistance.

The terminal plates 70 are each made of an approximately U-shaped metal sheet (e.g. an iron sheet with copper plating on the surface thereof, which is then plated with a low-melting metal, or a stainless steel sheet) having a size suitable for covering the upper side, outer peripheral side and lower side of an insulating base end portion 12.

That is, the fourth embodiment is an electronic component substrate 1-4 including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. The electronic component substrate 1-4 further has terminal plates 70 mounted on an end portion of the insulating base 10 in electrical connection with the terminal patterns 29 provided on the flexible circuit board 20.

Figure 15:
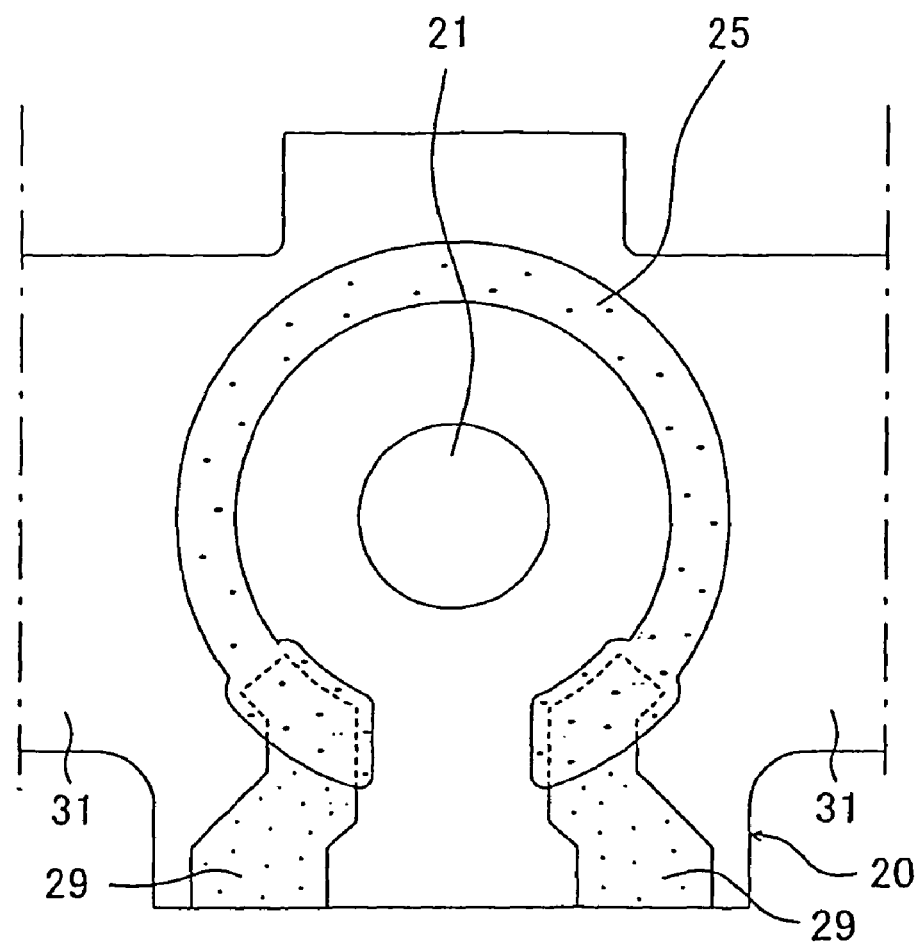
FIG. 15 is a diagram illustrating the method of producing the electronic component substrate 1-4.

Next, a method of producing the electronic component substrate 1-4 will be described. First, a flexible circuit board 20 as shown in FIG. 15 is prepared which has a through-hole 21 and further has a resistor pattern 25 and terminal patterns 29 formed on the surface thereof. The resistor pattern 25 is formed from a metal thin film deposited by physical vapor deposition or chemical vapor deposition. The flexible circuit board 20 has connecting portions 31 projecting from both side edges thereof. A large number of identical flexible circuit boards 20 are connected in parallel through the connecting portions 31.

Figure 16:
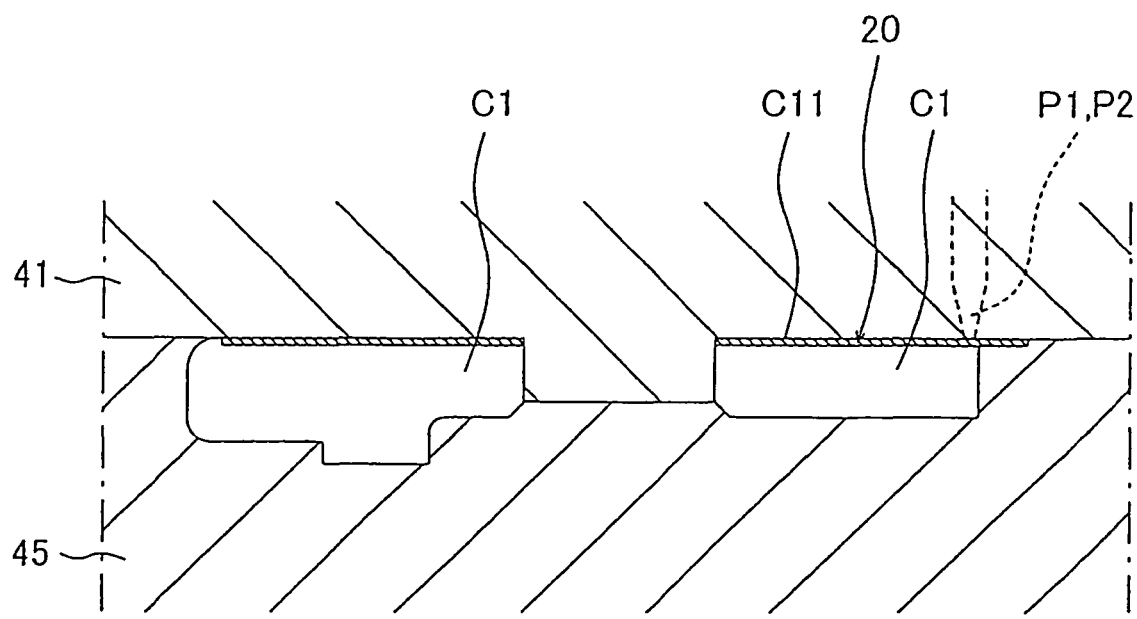
FIG. 16 is a diagram illustrating the method of producing the electronic component substrate 1-4.

Next, as shown in FIG. 16, each flexible circuit board 20 connected through the connecting portions 31 is inserted between a first mold member 41 and a second mold member 45. At this time, a cavity C1 having the same shape as the external shape of the electronic component substrate 1-4 is formed between the first and second mold members 41 and 45. The surface of the flexible circuit board 20 where the resistor pattern 25 is formed is abutted against an inner plane surface C11 of the cavity C1 on the side of the first mold member 41.

Then, a heated molten synthetic resin (nylon, polyphenylene sulfide, etc.) is injected from two resin injection ports (shown by arrows P1 and P2 in FIG. 13 and P1 and P2 in FIG. 16) provided in the first mold member 41 to fill the cavity C1 with the molten resin. After the molten resin has been cooled and solidified, the first and second mold members 41 and 45 are removed, and the connecting portions 31 projecting from both sides of the molded insulating base 10 are cut off.

Then, terminal plates 70 as shown in FIGS. 13 and 14 are mounted in such a manner as to cover the portions of the surface of the flexible circuit board 20 where the terminal patterns 29 are provided, in electrical connection with the terminal patterns 29, and further cover the surfaces of the terminal plate accommodating recesses 18 on the lower side of the insulating base 10 and the outer peripheral side of the insulating base 10. Consequently, an electronic component substrate 1-4 is completed which has the terminal plates 70 mounted on the insulating base end portion 12 in electrical connection with the terminal patterns 29 as shown in FIGS. 13 and 14.

That is, the fourth embodiment is a method of producing an electronic component substrate 1-4 by preparing a flexible circuit board 20 comprising a synthetic resin film provided thereon with a conductor pattern 25, the surface of which is slidingly contacted with a slider, and terminal patterns 29 connected to the conductor pattern 25, and further preparing terminal plates 70 made of metal sheets and mold members 41 and 45 having a cavity C1 with a shape that corresponds to the external shape of the electronic component substrate 1-4 to be produced. Then, the flexible circuit board 20 is accommodated in the cavity C1 between the mold members 41 and 45. At this time, the surface of the flexible circuit board 20 where the conductor pattern 25 is provided is abutted against one inner surface C11 of the cavity C1 (surface of the first mold member 41). Then, a molten molding resin is filled into the cavity C1. After the filled molding resin has been solidified, the mold members 41 and 45 are removed, whereby the flexible circuit board 20 is mounted on an insulating base 10 made of the molding resin in such a way that the conductor pattern 25 and the terminal patterns 29 are exposed. Thereafter, the terminal plates 70 are mounted on an insulating base end portion 12 in electrical connection with the terminal patterns 29 provided on the flexible circuit board 20.

It should be noted that the connection between the terminal plates 70 and the terminal patterns 29 may be made only with mechanical pressure contact force obtained by abutting them against each other directly. Alternatively, the terminal plates 70 and the terminal patterns 29 may be connected through an electrically conductive adhesive or the like. It should be noted that the configuration and mounting structure of the terminal plates 70 are not necessarily limited to those in this embodiment, but the terminal plates 70 may adopt any mounting structure, provided that the terminal plates 70 are mounted on the end portion of the insulating base 10 in electrical connection with the terminal patterns 29.

According to the above-described method of producing the electronic component substrate 1-4, the flexible circuit board 20 is insert-molded to the insulating base 10. Therefore, the electronic component substrate 1-4 can be produced easily, and the production cost can be reduced. In addition, because the insulating base 10 is a synthetic resin molded piece, the production thereof is facilitated, and the material cost can be reduced in comparison to the ceramic substrate. It is also possible to achieve a reduction in thickness easily and at reduced cost. Further, the electronic component substrate 1-4 can be mass-produced easily by simultaneously forming a large number of sets of resistor patterns 25 on a synthetic resin film, and then simultaneously molding insulating bases 10 together with respective flexible circuit boards 20 provided with respective resistor patterns 25 in each set, followed by cutting the integrally connected flexible circuit boards 20 from each other, thereby enabling each individual discrete product to be obtained. Thus, productivity is improved.

Figure 17:
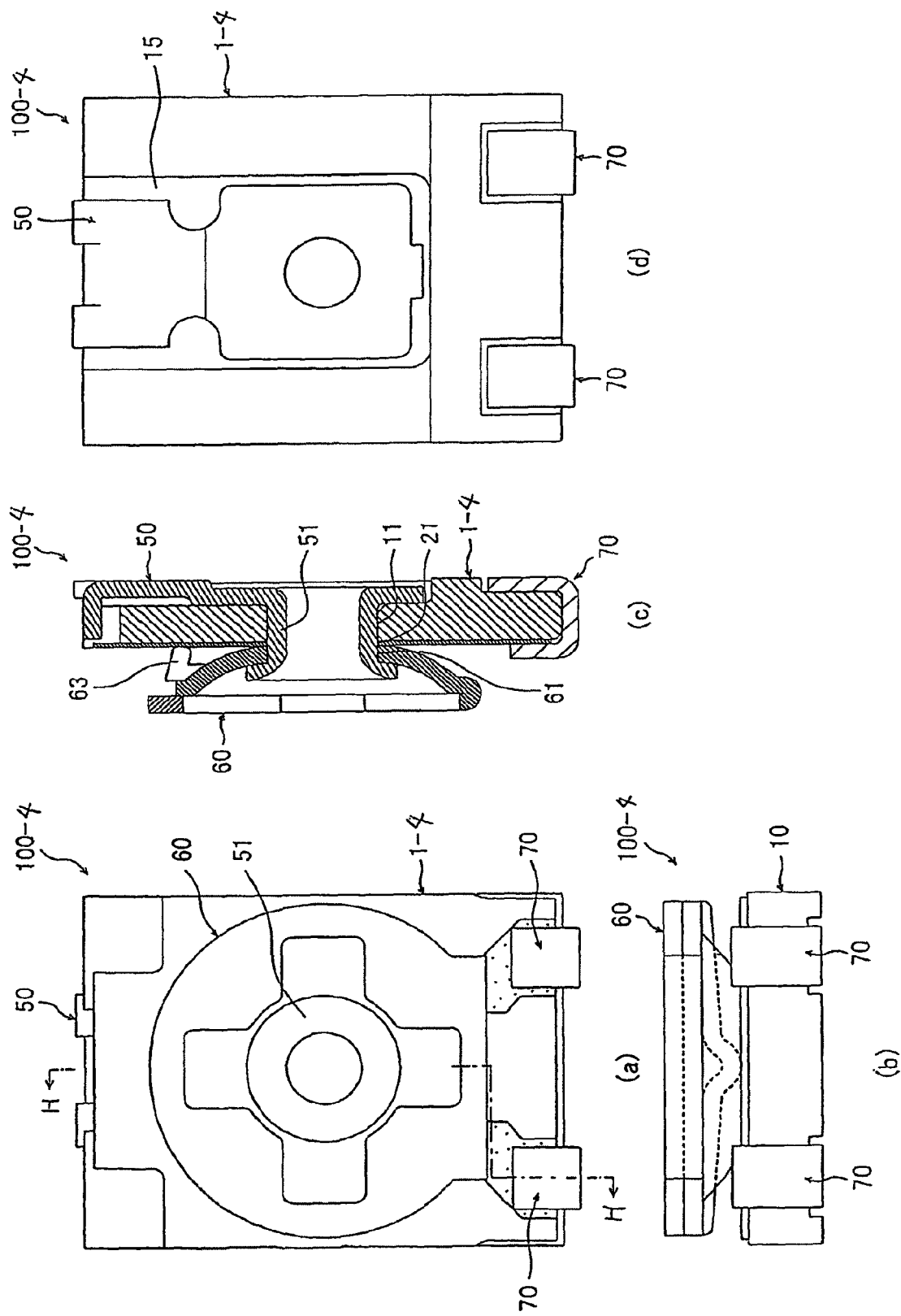

FIG. 17 is a diagram showing a pre-set variable resistor 100-4 constructed by using the electronic component substrate 1-4. FIG. 17(a) is a plan view. FIG. 17(b) is a front view. FIG. 17(c) is a sectional view in the direction of arrows H-H in FIG. 17(a). FIG. 17(d) is a rear view. As shown in these figures, the pre-set variable resistor 100-4 has a slider 60 that is installed on the upper side of the electronic component substrate 1-4. A collector plate 50 is installed on the lower side of the electronic component substrate 1-4. A cylindrical tubular projection 51 provided on the collector plate 50 is inserted through the through-holes 11 and 21. The distal end of the tubular projection 51 extending through the electronic component substrate 1-4 is inserted through a fitting hole 61 provided in the slider 60. Then, the projecting distal end of the tubular projection 51 is caulked, thereby mounting the slider 60 rotatably. The collector plate 50 is accommodated in the collector plate accommodating recess 15 provided on the lower side of the electronic component substrate 1-4. Rotating the slider 60 causes a sliding contact 63 provided on the slider 60 to slide on the surface of the resistor pattern 25 (see FIG. 14), thereby varying the resistance between the terminal plates 70 and the collector plate 50.

The pre-set variable resistor 100-4 is mounted on another circuit board having various electronic components mounted thereon. At this time, the terminal plates 70 are secured to a circuit pattern provided on the another circuit board by a connecting means using a low-melting metal or the like, which is accompanied by high temperature. In this regard, because the terminal plates 70 are used in the present invention, it is easy to secure the pre-set variable resistor 100-4 to the another circuit board with a connecting means accompanied by high temperature. On the other hand, it becomes possible to use materials that may be easily affected by heat for the terminal patterns 29 and the flexible circuit board 20. The terminal plates 70 serve also as mechanical securing means for securing the flexible circuit board 20 to the insulating base 10 by clamping them together.

Fifth Embodiment

Figure 18:
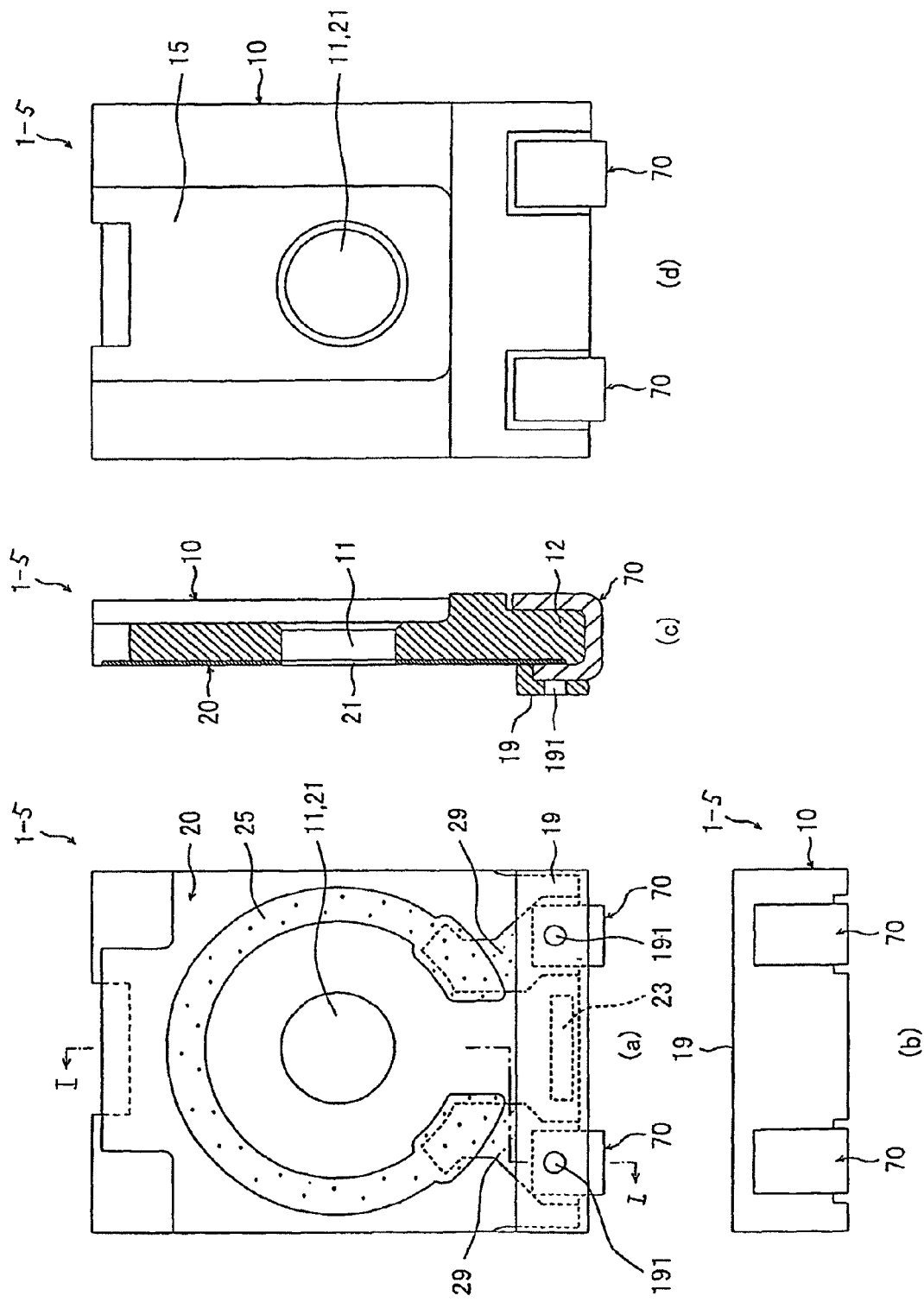

FIG. 18 is a diagram showing an electronic component substrate 1-5 produced by using a fifth embodiment of the present invention. FIG. 18(a) is a plan view. FIG. 18(b) is a front view. FIG. 18(c) is a sectional view in the direction of arrows I-I in FIG. 18(a). FIG. 18(d) is a rear view. In the electronic component substrate 1-5 shown in these figures, the same portions as those of the electronic component substrate 1-4 are denoted by the same reference numerals, and a detailed description thereof is omitted. In the electronic component substrate 1-5 also, a flexible circuit board 20 is integrally mounted on the upper side of an insulating base 10 by insert molding, and terminal plates 70 are mounted on an insulating base end portion 12 in electrical connection with terminal patterns 29. A resistor pattern 25 is also made of a metal thin film deposited by physical vapor deposition or chemical vapor deposition.

Figure 19:
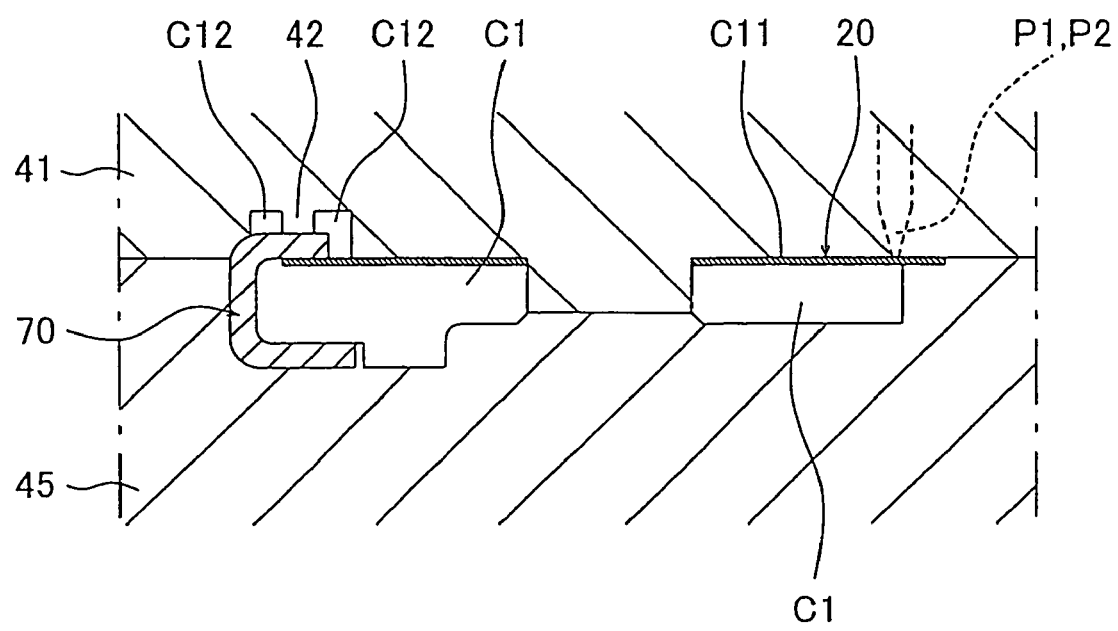
FIG. 19 is a diagram illustrating the method of producing the electronic component substrate 1-5.

The electronic component substrate 1-5 differs from the electronic component substrate 1-4 in that the terminal plates 70 are also insert-molded to the insulating base 10 in addition to the flexible circuit board 20, thereby integrating together these components into one unit. That is, the electronic component substrate 1-5 is produced by the following method. As shown in FIG. 19, a flexible circuit board 20 and terminal plates 70 are previously inserted into a cavity C1 between first and second mold members 41 and 45 for molding an insulating base 10, and a molten synthetic resin is injected into the cavity C1 from resin injection ports P1 and P2 (provided at the same positions as in the fourth embodiment) and cooled to be solidified, thereby producing an electronic component substrate 1-5 in which the flexible circuit board 20 and the terminal plates 70 are integrally molded on the insulating base 10.

That is, the fifth embodiment is an electronic component substrate 1-5 including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. The electronic component substrate 1-5 further has terminal plates 70 mounted on an end portion of the insulating base 10 in electrical connection with the terminal patterns 29 provided on the flexible circuit board 20. The terminal plates 70 are also insert-molded to the insulating base 10.

Further, the fifth embodiment is a method of producing an electronic component substrate 1-5 by preparing a flexible circuit board 20 comprising a synthetic resin film provided thereon with a conductor pattern 25, the surface of which is slidingly contacted with a slider, and terminal patterns 29 connected to the conductor pattern 25, and further preparing terminal plates 70 made of metal sheets and mold members 41 and 45 having a cavity C1 with a shape that corresponds to the external shape of the electronic component substrate 1-5 to be produced. Then, the flexible circuit board 20 and the terminal plates 70 are accommodated in the cavity C1 between the mold members 41 and 45. At this time, the surface of the flexible circuit board 20 where the conductor pattern 25 is provided is abutted against one inner surface C11 of the cavity C1 (surface of the first mold member 41). At the same time, the terminal plates 70 are partially abutted against or opposed to the terminal patterns 29 on the flexible circuit board 20. Then, a molten molding resin is filled into the cavity C1. After the filled molding resin has been solidified, the mold members 41 and 45 are removed, whereby the flexible circuit board 20 is mounted on an insulating base 10 made of the molding resin in such a way that the conductor pattern 25 and the terminal patterns 29 are exposed, and at the same time, the terminal plates 70 are mounted on an end portion of the insulating base 10 in electrical connection with the terminal patterns 29 provided on the flexible circuit board 20.

It should be noted that a cavity C12 constituting a part of the cavity C1 is provided in the first mold member 41 at a position above the terminal plates 70. The cavity C12 is provided therein with projection-shaped abutting portions 42 that support the terminal plates 70 from the rear side thereof so that the terminal plates 70 will not be displaced by the molten molding resin injected into the cavities C1 and C12 when the insulating base 10 is molded. The cavity C12 forms a terminal plate retaining portion 19 as shown in FIG. 18, which is made of the same synthetic resin as the insulating base 10 to cover the upper side of the terminal plates 70, thereby ensuring the securing of the terminal plates 70 to the insulating base 10 and also ensuring the connection of the terminal plates 70 to the terminal patterns 29. It should be noted that an opening 23 is provided between the terminal patterns 29 on the flexible circuit board 20 to provide an integral connection between the insulating base 10 and the terminal plate retaining portion 19. Two holes 191 in the terminal plate retaining portion 19 are formed by the abutting portions 42 provided in the cavity C12 of the first mold member 41.

Thus, not only the flexible circuit board 20 but also the terminal plates 70 are insert-molded to the insulating base 10, whereby it becomes unnecessary to carry out the step of mounting the terminal plates 70 onto the insulating base 10, which would otherwise be necessary to carry out as a separate step. In addition, the terminal plates 70 can be secured to the insulating base 10 easily and surely, and electrical connection of the terminal plates 70 to the terminal patterns 29 can be effected easily and reliably. In addition, because the insulating base 10 is a synthetic resin molded piece, the production thereof is facilitated, and the material cost can be reduced in comparison to the ceramic substrate. It is also possible to achieve a reduction in thickness easily and at reduced cost. It should be noted that the terminal plate retaining portion 19 is not necessarily needed and may be omitted.

Sixth Embodiment

Figure 20:
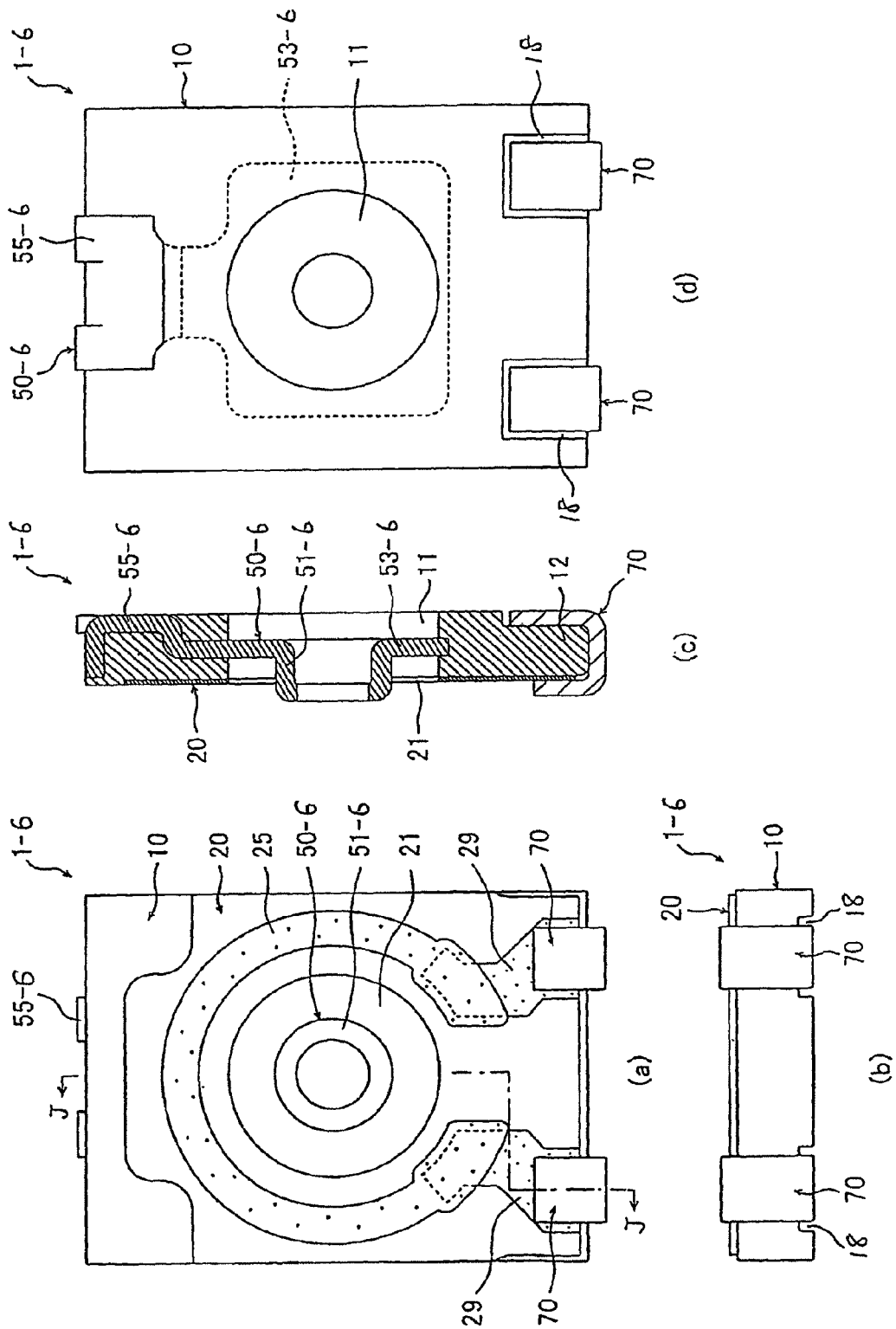

FIG. 20 is a diagram showing an electronic component substrate 1-6 produced by using a sixth embodiment of the present invention. FIG. 20(*a*) is a plan view. FIG. 20(*b*) is a front view. FIG. 20(*c*) is a sectional view in the direction of arrows J-J in FIG. 20(*a*). FIG. 20(*d*) is a rear view. In the electronic component substrate 1-6 shown in these figures, the same portions as those of the electronic component substrate 1-4 are denoted by the same reference numerals, and a detailed description thereof is omitted. In the electronic component substrate 1-6 also, a flexible circuit board 20 is integrally mounted on the upper side of an insulating base 10 by insert molding, and terminal plates 70 are mounted on an insulating base end portion (end edge) 12 in electrical connection with terminal patterns 29 provided on the flexible circuit board 20.

The electronic component substrate 1-6 differs from the electronic component substrate 1-4 in that a collector plate 50-6 is also integrally molded in the insulating base 10 of the electronic component substrate 1-4. The collector plate 50-6 has an approximately rectangular base member 53-6 made of a metal sheet. The base member 53-6 is provided in the center thereof with a tubular projection 51-6 projecting from the surface of the electronic component substrate 1-6 where the resistor pattern 25 is provided. The base member 53-6 further has an approximately rectangular connecting portion 55-6 projecting outward from one outer peripheral side of the base member 53-6. The connecting portion 55-6 is bent twice at approximately right angles so as to be exposed on the surface of the electronic component substrate 1-6 opposite to the surface thereof where the resistor pattern 25 is provided. The distal end of the connecting portion 55-6 is trisected, and the central portion of the trisected distal end is bent at approximately right angles toward the surface of the electronic component substrate 1-6 where the resistor pattern 25 is provided. In the electronic component substrate 1-6, the collector plate 50-6 is embedded in the insulating base 10 by insert molding in such a way that the tubular projection 51-6 is positioned in (in the center of) a through-hole 11 in the insulating base 10 (also in a through-hole 21 in the flexible circuit board 20). At this time, the lower side of the connecting portion 55-6 is exposed on the lower side of the insulating base 10, as has been stated above. The tubular projection 51-6 projects from the upper side of the flexible circuit board 20. With this arrangement, the insulating base 10, the flexible circuit board 20 and the collector plate 50-6 can be integrated together at the same time as the insulating base 10 is molded. Accordingly, the production process can be simplified.

Next, a method of producing the electronic component substrate 1-6 will be described. First, a flexible circuit board 20 similar to that shown in FIG. 15 is prepared which has a through-hole 21 and a resistor pattern 25 and terminal patterns 29 formed on the surface thereof. The resistor pattern 25 is formed from a metal thin film deposited by physical vapor deposition or chemical vapor deposition. In addition, a collector plate 50-6 as shown in FIG. 20 is prepared. As has been stated above, the flexible circuit board 20 has connecting portions 31 projecting from both side edges thereof. A large number of identical flexible circuit boards 20 are connected in parallel through the connecting portions 31. The collector plate 50-6 is also connected to other collector plates 50-6 through the connecting portion 55-6 that is connected at the distal end thereof to a connecting member (not shown). Thus, a large number of identical collector plates 50-6 are connected in parallel through the connecting member.

Figure 21:
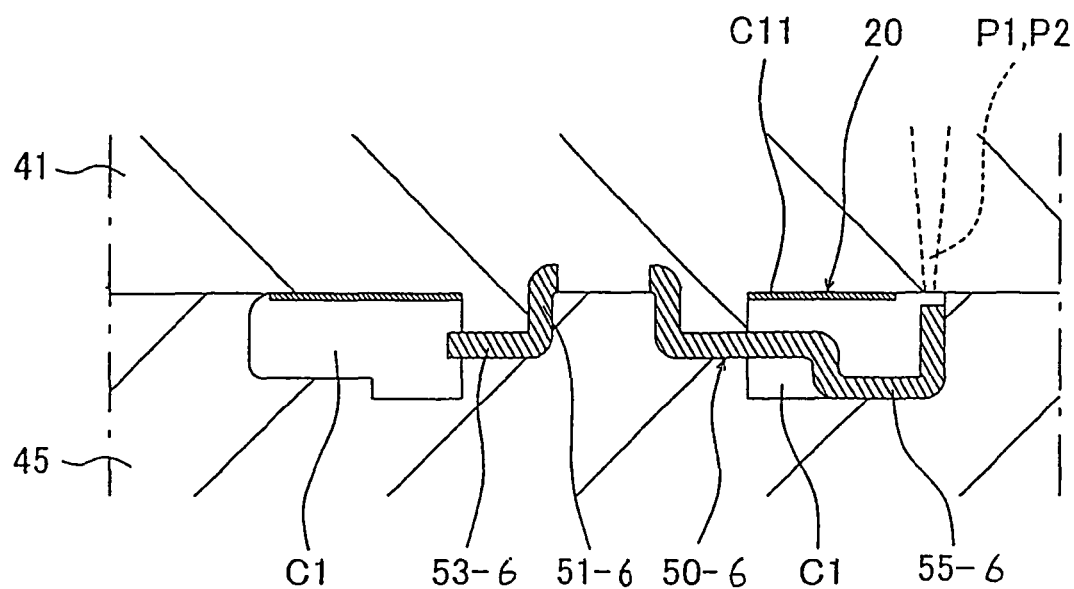
FIG. 21 is a diagram illustrating the method of producing the electronic component substrate 1-6.

Next, as shown in FIG. 21, each flexible circuit board 20 connected through the connecting portions 31 and each collector plate 50-6 connected through the connecting member is inserted between a first mold member 41 and a second mold member 45. At this time, a cavity C1 having the same shape as the external shape of the electronic component substrate 1-6 is formed between the first and second mold members 41 and 45. The surface of the flexible circuit board 20 where the resistor pattern 25 is formed is abutted against an inner plane surface C11 of the cavity C1 on the side of the first mold member 41. More specifically, the flexible circuit board 20 is accommodated in the cavity C1 between the first and second mold members 41 and 45. At this time, the surface of the flexible circuit board 20 where the resistor pattern 25 is provided is abutted against one inner surface C11 of the cavity C1 (surface of the first mold member 41). Meanwhile, the collector plate 50-6 is clamped at the base member 53-6 thereof between the first and second mold members 41 and 45. At the same time, a projection defined by the two mold members 41 and 45 is inserted into the tubular projection 51-6, and the lower side of the connecting portion 55-6 is brought into close contact with the surface of the second mold member 45.

Then, a heated molten synthetic resin (nylon, polyphenylene sulfide, etc.) is injected from resin injection ports P1 and P2 (provided at the same positions as in FIG. 13) provided on the first mold member 41 side of the cavity C1 to fill the cavity C1 with the molten resin. The injection pressure of the molten resin causes the flexible circuit board 20 to be pressed against the inner plane surface C11 of the first mold member 41. In this state, the injected resin is cooled and solidified. Then, the first and second mold members 41 and 45 are removed, and the connecting portions 31 projecting from both sides of the molded insulating base 10 and the projecting distal end of the connecting portion 55-6 of the collector plate 50-6 are cut off. Thus, the electronic component substrate 1-6 shown in FIG. 20 is completed. It should be noted that a through-hole 11 is provided in the center of the insulating base 10, and a horseshoe-shaped resistor pattern 25 is provided on the flexible circuit board 20 at the outer periphery of the through-hole 11. Further, terminal patterns 29 are provided at both ends of the resistor pattern 25. Further, the collector plate 50-6 is integrally embedded in the insulating base 10. The tubular projection 51-6 of the collector plate 50-6 extends through the through-hole 11, which is provided in the insulating base 10, and projects beyond the upper side of the insulating base 10. The base member 53-6 is embedded in the insulating base 10. The connecting portion 55-6 is exposed on the lower side of the insulating base 10 (at one outer peripheral side of the insulating base 10 opposite to the terminal patterns 29 exposed on the upper side of the insulating base 10).

Then, terminal plates 70 as shown in FIG. 20 are mounted in such a manner as to cover the portions of the surface of the flexible circuit board 20 where the terminal patterns 29 are provided, in electrical connection with the terminal patterns 29, and further cover the surfaces of the terminal plate accommodating recesses 18 on the lower side of the insulating base 10 and the outer peripheral side of the insulating base 10. Thus, an electronic component substrate 1-6 is completed which has the terminal plates 70 mounted on the insulating base end portion 12 in electrical connection with the terminal patterns 29 as shown in FIG. 20.

That is, the sixth embodiment is an electronic component substrate 1-6 including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. The electronic component substrate 1-6 further has terminal plates 70 mounted on an end portion of the insulating base 10 in electrical connection with the terminal patterns 29 provided on the flexible circuit board 20. Further, the electronic component substrate 1-6 has a collector plate 50-6 insert-molded to the insulating base 10.

In addition, the sixth embodiment is a method of producing an electronic component substrate 1-6 by preparing a flexible circuit board 20 comprising a synthetic resin film provided thereon with a conductor pattern 25, the surface of which is slidingly contacted with a slider, and terminal patterns 29 connected to the conductor pattern 25, and further preparing terminal plates 70 made of metal sheets and mold members 41 and 45 having a cavity C1 with a shape that corresponds to the external shape of the electronic component substrate 1-6 to be produced. Then, the flexible circuit board 20 is accommodated in the cavity C1 between the mold members 41 and 45. At this time, the surface of the flexible circuit board 20 where the conductor pattern 25 is provided is abutted against one inner surface C11 of the cavity C1 (surface of the first mold member 41). Then, a molten molding resin is filled into the cavity C1. After the filled molding resin has been solidified, the mold members 41 and 45 are removed, whereby the flexible circuit board 20 is mounted on an insulating base 10 made of the molding resin in such a way that the conductor pattern 25 and the terminal patterns 29 are exposed. Thereafter, the terminal plates 70 are mounted on an end portion of the insulating base 10 in electrical connection with the terminal patterns 29 provided on the flexible circuit board 20. Further, a collector plate 50-6 made of a metal sheet is accommodated in the cavity C1 between the mold members 41 and 45 at the same time as the flexible circuit board 20 is accommodated in the cavity C1, thereby embedding the collector plate 50-6 in the insulating base 10 made of the molding resin.

According to the above-described method of producing the electronic component substrate 1-6, the flexible circuit board 20 and the collector plate 50-6 are insert-molded to the insulating base 10. Therefore, it becomes unnecessary to carry out the step of mounting the collector plate 50-6 onto the insulating base 10, which would otherwise be necessary to carry out as a separate step. Accordingly, the electronic component substrate 1-6 that is equipped with the collector plate 50-6 made of a metal sheet can be produced easily, and the production cost can be reduced. In addition, because the insulating base 10 is a synthetic resin molded piece, the production thereof is facilitated, and the material cost can be reduced in comparison to the ceramic substrate. It is also possible to achieve a reduction in thickness easily and at reduced cost.

Figure 22:
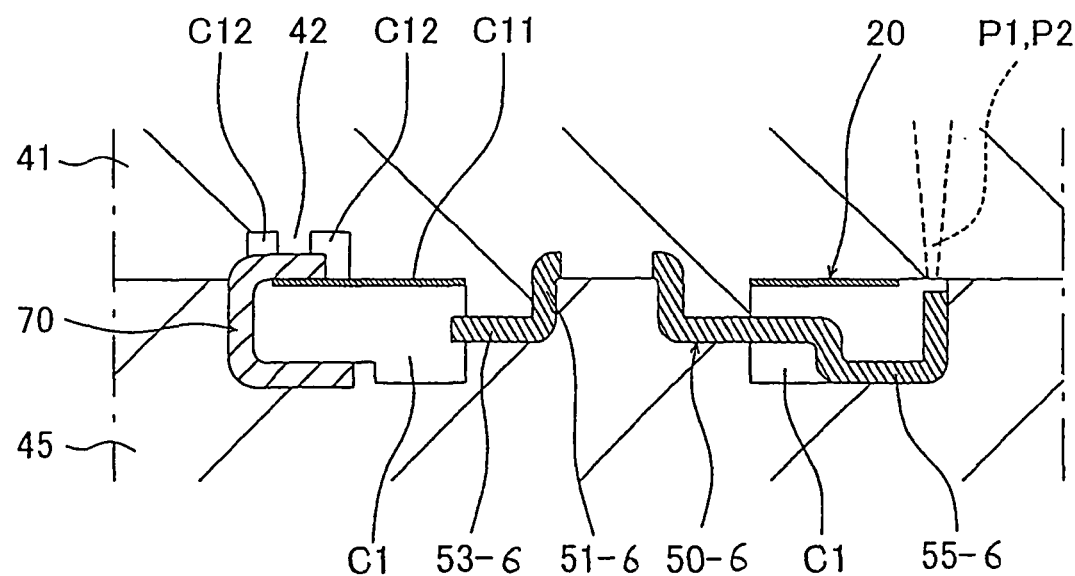
FIG. 22 is a diagram illustrating the method of producing an electronic component substrate 1-6A.

Incidentally, as a modification of the sixth embodiment, as shown in FIG. 22, the terminal plates 70 may be inserted between the first and second mold members 41 and 45 in addition to the flexible circuit board 20 and the collector plate 50-6 in the same way as in the fifth embodiment. That is, an electronic component substrate 1-6A (not shown) may be produced by a method wherein, as shown in FIG. 22, the flexible circuit board 20, the collector plate 50-6 and the terminal plates 70 are previously inserted into a cavity C1 between first and second mold members 41 and 45 for molding the electronic component substrate 1-6A. Then, a molten synthetic resin is injected into the cavity C1 from resin injection ports P1 and P2 (provided at the same positions as in the fourth embodiment) and cooled to be solidified, thereby integrally molding the flexible circuit board 20, the collector plate 50-6 and the terminal plates 70 with the insulating base 10.

That is, this modification discloses the invention claimed in claim 9 depending on claim 8, which is an electronic component substrate 1-6A including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. The electronic component substrate 1-6A further has terminal plates 70 mounted on an end portion of the insulating base 10 in electrical connection with the terminal patterns 29 provided on the flexible circuit board 20. The terminal plates 70 are insert-molded to the insulating base 10. Further, the electronic component substrate 1-6A has a collector plate 50-6 insert-molded to the insulating base 10.

In addition, the above-described modification is a method of producing an electronic component substrate 1-6A by preparing a flexible circuit board 20 comprising a synthetic resin film provided thereon with a conductor pattern 25, the surface of which is slidingly contacted with a slider, and terminal patterns 29 connected to the conductor pattern 25, and further preparing terminal plates 70 made of metal sheets and mold members 41 and 45 having a cavity C1 with a shape that corresponds to the external shape of the electronic component substrate 1-6A to be produced. Then, the flexible circuit board 20 and the terminal plates 70 are accommodated in the cavity C1 between the mold members 41 and 45. At this time, the surface of the flexible circuit board 20 where the conductor pattern 25 is provided is abutted against one inner surface C11 of the cavity C1 (surface of the first mold member 41). At the same time, the terminal plates 70 are partially abutted against or opposed to the terminal patterns 29 on the flexible circuit board 20. Then, a molten molding resin is filled into the cavity C1. After the filled molding resin has been solidified, the mold members 41 and 45 are removed, whereby the flexible circuit board 20 is mounted on an insulating base 10 made of the molding resin in such a way that the conductor pattern 25 and the terminal patterns 29 are exposed, and at the same time, the terminal plates 70 are mounted on an end portion of the insulating base 10 in electrical connection with the terminal patterns 29 provided on the flexible circuit board 20. Further, a collector plate 50-6 made of a metal sheet is accommodated in the cavity C1 between the mold members 41 and 45 at the same time as the flexible circuit board 20 is accommodated in the cavity C1, thereby embedding the collector plate 50-6 in the insulating base 10 made of the molding resin.

According to the above-described method of producing the electronic component substrate 1-6A, the flexible circuit board 20, the collector plate 50-6 and the terminal plates 70 are insert-molded to the insulating base 10. Therefore, it becomes unnecessary to carry out the step of mounting the collector plate 50-6 onto the insulating base 10 and the step of mounting the terminal plates 70 onto the insulating base 10, which would otherwise be necessary to carry out as separate steps. Accordingly, the electronic component substrate 1-6A that is equipped with the collector plate 50-6 and the terminal plates 70, which are made of metal sheets, can be produced easily, and the production cost can be reduced. In addition, because the insulating base 10 is a synthetic resin molded piece, the production thereof is facilitated, and the material cost can be reduced in comparison to the ceramic substrate. It is also possible to achieve a reduction in thickness easily and at reduced cost.

It should be noted that a cavity C12 constituting a part of the cavity C1 is provided in the first mold member 41 at a position above the terminal plates 70. The cavity C12 is provided therein with projection-shaped abutting portions 42 that support the terminal plates 70 from the rear side thereof so that the terminal plates 70 will not be displaced by the molten molding resin injected into the cavities C1 and C12 when the insulating base 10 is molded, as in the case of the fifth embodiment.

In a case where the terminal plates 70 and the collector plate 50-6 are insert-molded to the insulating base 10, these members are simultaneously formed in advance on the same metal sheet in the state of being connected together through connecting portions, and this integral structure is accommodated in the mold to mold the insulating base 10. Thereafter, the connecting portions are cut off. By doing so, it is possible to achieve a virtual reduction in the number of required components and to simplify the production process.

Figure 23:
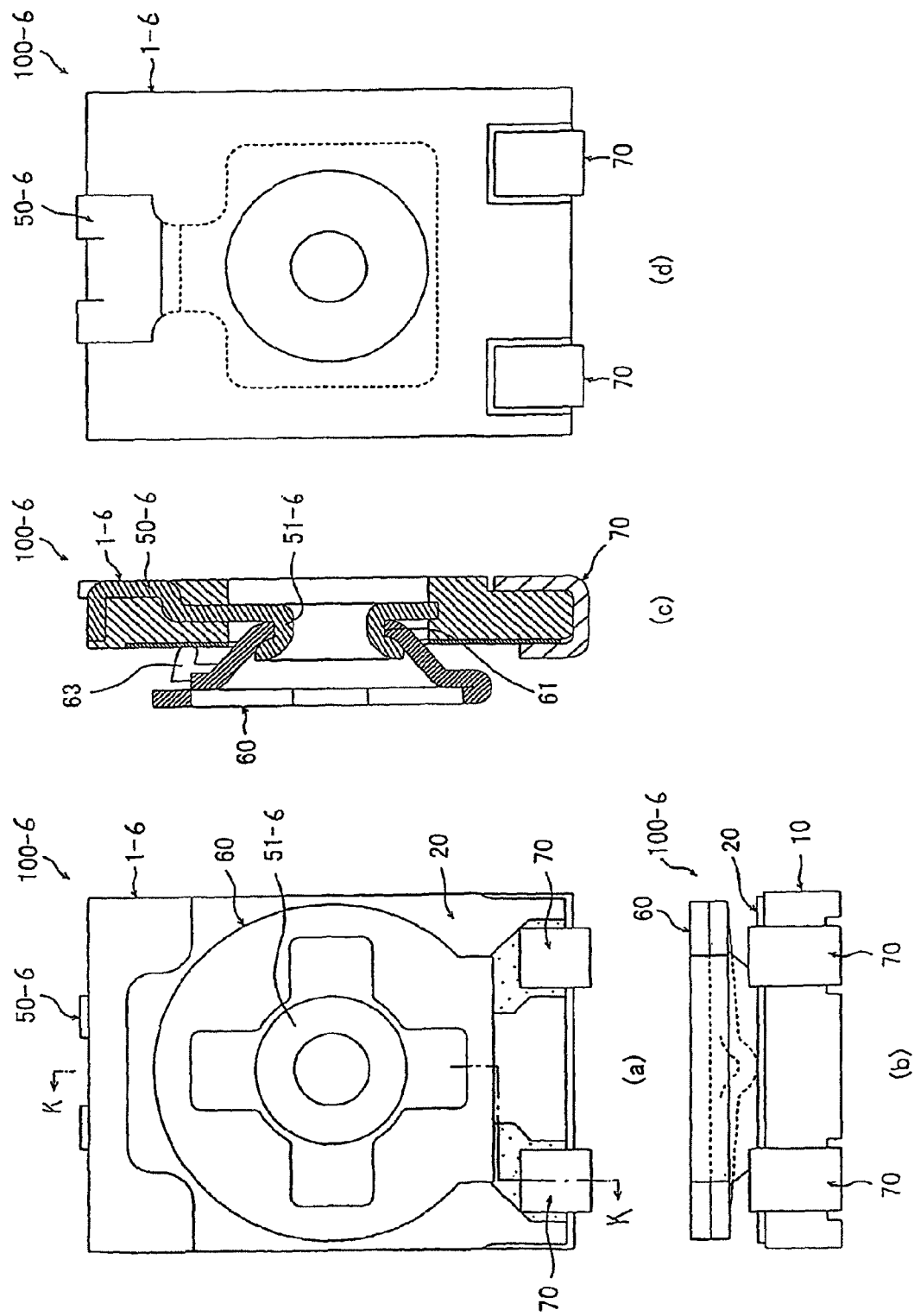

FIG. 23 is a diagram showing a pre-set variable resistor 100-6 constructed by using the electronic component substrate 1-6. FIG. 23(a) is a plan view. FIG. 23(b) is a front view. FIG. 23(c) is a sectional view in the direction of arrows K-K in FIG. 23(a). FIG. 23(d) is a rear view. As shown in these figures, the pre-set variable resistor 100-6 has a slider 60 that is installed on the upper side of the electronic component substrate 1-6. That is, the tubular projection 51-6 provided on the collector plate 50-6 is inserted through a fitting hole 61 provided in the slider 60. Then, the projecting distal end of the tubular projection 51-6 is caulked, thereby mounting the slider 60 rotatably. Rotating the slider 60 causes a sliding contact 63 provided on the slider 60 to slide on the surface of the resistor pattern 25 (see FIG. 20), thereby varying the resistance between the terminal plates 70 and the collector plate 50-6.

Seventh Embodiment

Figure 24:
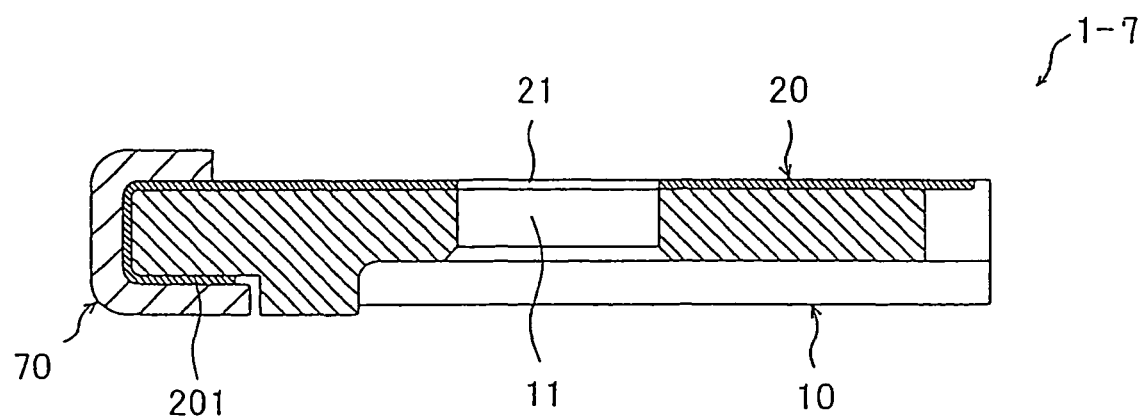
FIG. 24 is a sectional view showing an electronic component substrate 1-7 producing by using a seventh embodiment of the present invention.

In the foregoing embodiments, the portion of the flexible circuit board 20 where the terminal patterns 29 are provided is disposed only on the upper side of the insulating base 10. However, the above-described electronic component substrates may be arranged as shown by an electronic component substrate 1-7 in FIG. 24. That is, an end portion 201 of the flexible circuit board 20 where the terminal patterns 29 (not explicitly shown in FIG. 24) are provided is folded over from the upper side toward the lower side of the insulating base 10 along an outer peripheral side thereof, and the terminal plates 70 are mounted so as to cover the folded portion of the flexible circuit board 20. In this case also, the flexible circuit board 20 or a combination of the flexible circuit board 20 and the terminal plates 70 is inserted into the mold and molded integrally with the insulating base 10. It should be noted that in this case the terminal patterns 29 may be provided only on the upper side of the flexible circuit board 20. Alternatively, the terminal patterns 29 may be provided to extend over from the upper side to the outer peripheral side or further to the lower side of the flexible circuit board 20.

Eighth Embodiment

Figure 26:
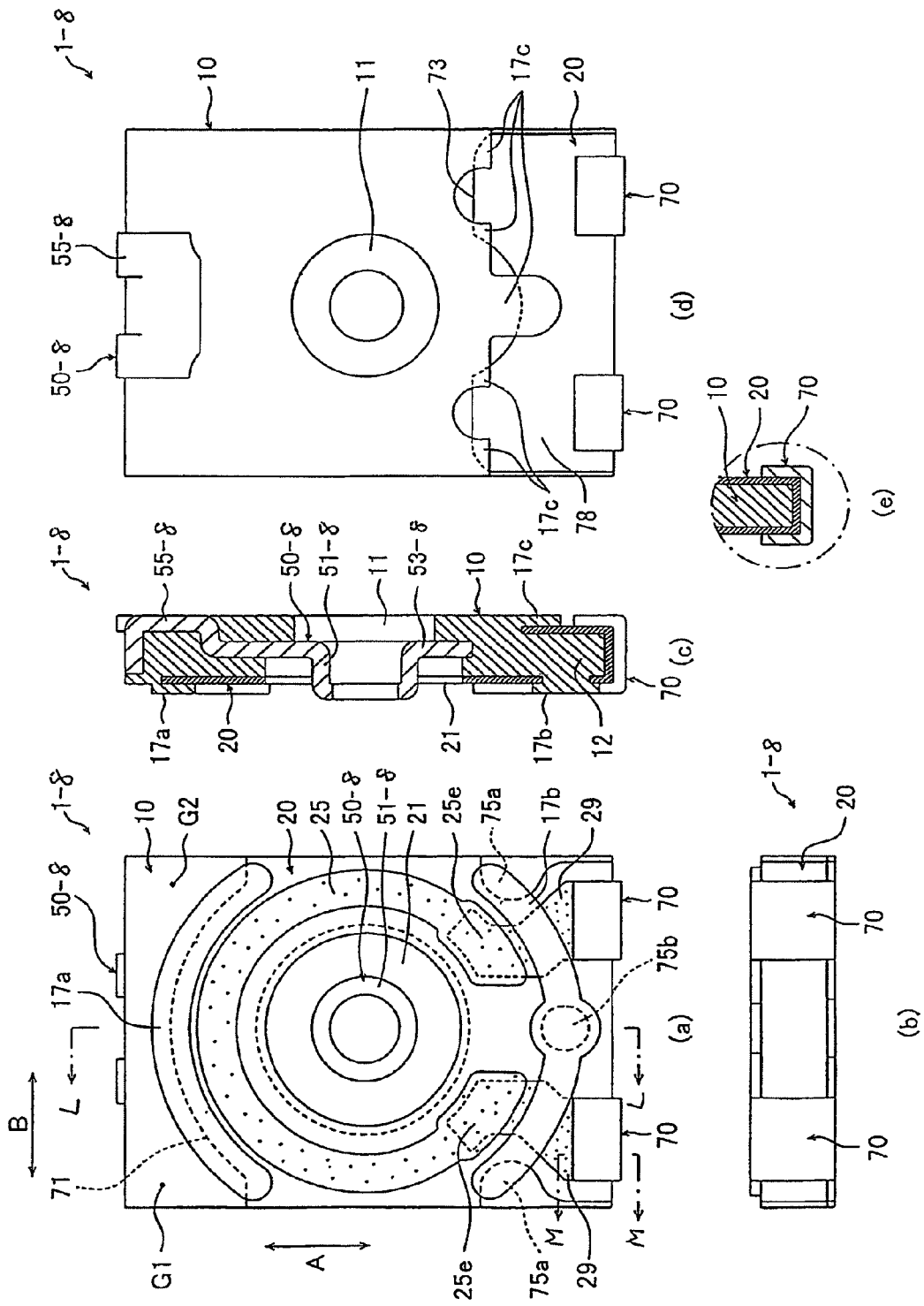

FIGS. 25 and 26 are diagrams showing an electronic component substrate 1-8 according to an eighth embodiment of the present invention. FIG. 25(a) is a perspective view as seen from above. FIG. 25(b) is a perspective view as seen from below. FIG. 26(a) is a plan view. FIG. 26(b) is a front view. FIG. 26(c) is a sectional view in the direction of arrows L-L in FIG. 26(a). FIG. 26(d) is a rear view. FIG. 26(e) is a sectional view in the direction of arrows M-M in FIG. 26(a). In the electronic component substrate 1-8 shown in these figures, the same portions as those of the electronic component substrates 1-4, 1-5, 1-6 and 1-7 are denoted by the same reference numerals, and a detailed description thereof is omitted. In the electronic component substrate 1-8 also, a flexible circuit board 20 is integrally mounted on the upper side of an insulating base 10 by insert molding. A resistor pattern 25 formed on the flexible circuit board 20 is made of a metal thin film deposited by physical vapor deposition or chemical vapor deposition. It should be noted that the constituent material of each member constituting the electronic component substrate 1-8 is the same as that of each corresponding member in the fourth to seventh embodiments, and the method of producing the electronic component substrate 1-8 is also the same as in the fourth to seventh embodiments.

In this embodiment also, the insulating base 10 is an approximately rectangular plate-shaped synthetic resin molded piece. A collector plate 50-8 is integrally mounted in the insulating base 10 by insert molding as in the case of the foregoing electronic component substrate 1-6. The collector plate 50-8 has a base member 53-8 provided with a tubular projection 51-8. The base member 53-8 has an approximately rectangular connecting portion 55-8 projecting outward from one side of the base member 53-8. The tubular projection 51-8 is installed in the insulating base 10 so as to be positioned in (in the center of) a through-hole 11 provided in the insulating base 10. The inner diameter of the through-hole 11 is larger than the outer diameter of the tubular projection 51-8. At this time, the lower side of the connecting portion 55-8 is exposed on the lower side of the insulating base 10.

The tubular projection 51-8 projects from the upper side of the flexible circuit board 20. With this arrangement, the insulating base 10, the flexible circuit board 20 and the collector plate 50-8 can be integrated together at the same time, in the same way as in the sixth embodiment. Accordingly, the production process can be simplified.

Figure 27:
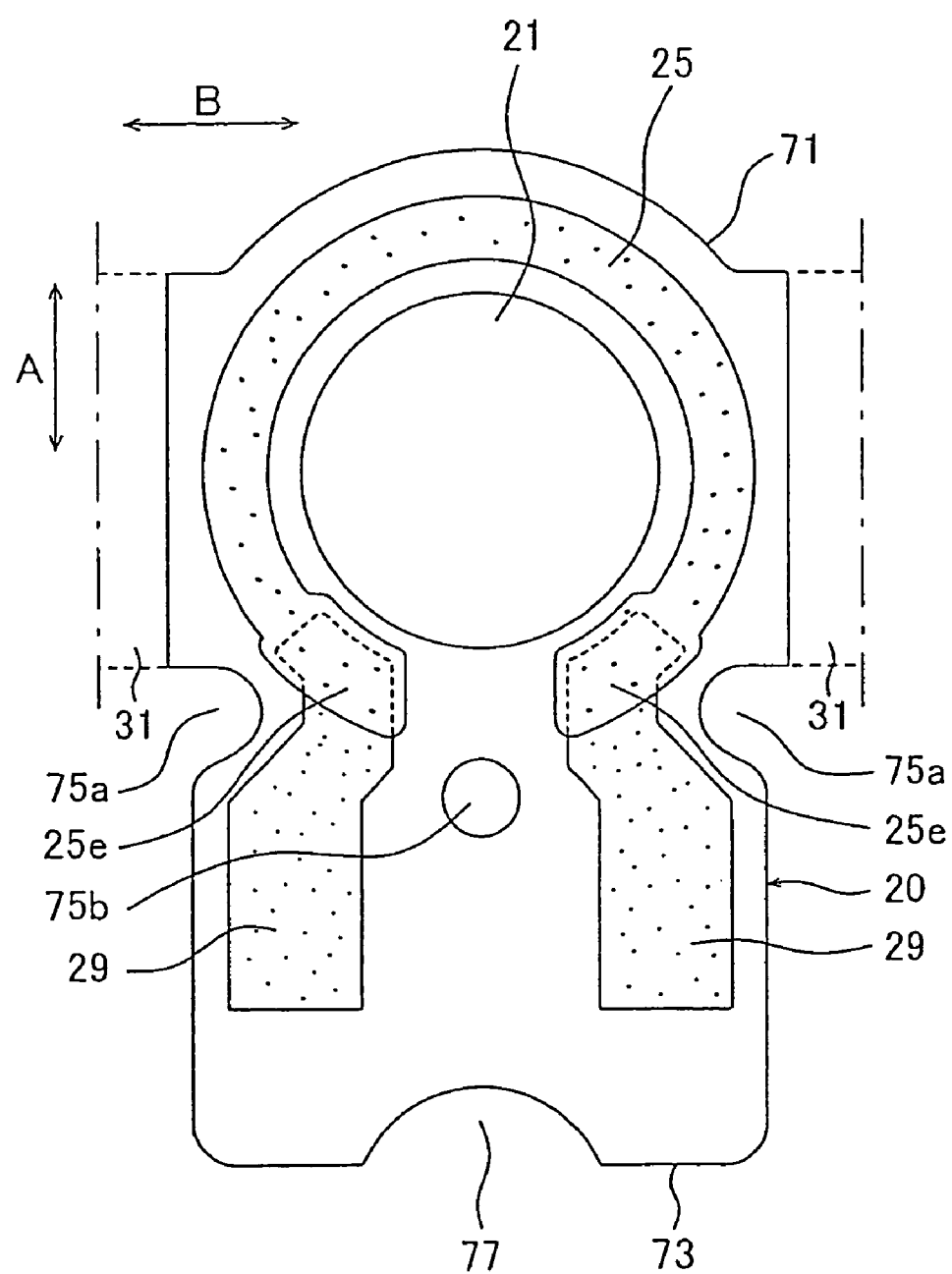
FIG. 27 is a diagram illustrating the method of producing the electronic component substrate 1-8.

As shown in FIG. 27, the flexible circuit board 20 is a thermoplastic synthetic resin film having an approximately rectangular configuration (in which the width is approximately equal to the width of the insulating base 10, and the length is longer than the length of the insulating base 10 by a predetermined dimension). The center of the synthetic resin film is provided with a through-hole 21 at a position corresponding to the through-hole 11. The through-hole 21 has the same inner diameter as that of the through-hole 11. Further, a horseshoe-shaped conductor pattern (hereinafter referred to as "resistor pattern" in this embodiment) 25 is provided on the surface of the synthetic resin film at the outer periphery of the through-hole 21. Further, approximately rectangular terminal patterns 29 extending along the longitudinal direction (A) are provided on the surface of the synthetic resin film in electrical connection with both ends 25e of the resistor pattern 25. As shown in FIG. 26, an edge portion of the flexible circuit board 20 on the side thereof where the terminal patterns 29 are provided is folded over from the upper side toward the lower side of the insulating base 10 along one outer peripheral side thereof. Consequently, the flexible circuit board 20 is mounted on the insulating base 10 in a folded state so that the surface of the flexible circuit board 20 is exposed on the upper side, outer peripheral side and lower side of the insulating base 10. Accordingly, the resistor pattern 25 is exposed on the upper side of the insulating base 10, and the terminal patterns 29 are exposed over an area extending from the upper side to the lower side of the insulating base 10 along the outer peripheral side thereof.

In the electronic component substrate 1-8, the insulating base 10 is integrally provided with retaining portions 17a, 17b and 17c formed of an insert-molding resin. The retaining portion 17a has an arcuate configuration to cover an end edge 71 of the flexible circuit board 20 outside the resistor pattern 25, which is one end of the flexible circuit board 20 (on the side thereof where the resistor pattern 25 is provided) in the longitudinal direction (A) (it should be noted that the retaining portion 17a does not cover the resistor pattern 25). The retaining portion 17b is provided near the outer peripheries of the ends 25e of the resistor pattern 25 on the flexible circuit board 20. The retaining portion 17b has an arcuate configuration to cover the two terminal patterns 29. The retaining portion 17c is disposed on the lower side of the insulating base 10 and has a flat plate-shaped configuration flush with the lower side of the insulating base 10 to cover an end edge 73 of the flexible circuit board 20 on the side thereof where the terminal patterns 29 are provided. With the retaining portions 17a, 17b and 17c, the flexible circuit board 20 is firmly secured to the insulating base 10.

The end edge 71 of the flexible circuit board 20 is formed in an arcuate configuration in conformity to the arcuate shape of the resistor pattern 25. The retaining portion 17a is also formed in an arcuate configuration in conformity to the arcuate shape of the resistor pattern 25.

The flexible circuit board 20 is provided with a pair of resin insertion portions 75a formed by concavely cutting two longitudinally extending sides of the flexible circuit board 20 [i.e. both ends in the lateral direction (B) of the flexible circuit board 20] at the outer peripheries of the joints of the resistor pattern 25 and the terminal patterns 29. In addition, a resin insertion portion 75b defined by a through-hole is provided between the two terminal patterns 29. The retaining portion 17b is molded over the resin insertion portions 75a and 75b and in an arcuate configuration in conformity to the arcuate shape of the resistor pattern 25. The retaining portion 17b is connected to the molding resin constituting the insulating base 10 at the lower side thereof through the resin insertion portions 75a and 75b.

The end edge 73 of the flexible circuit board 20, which is the other end (on the side where the terminal patterns 29 are provided) in the longitudinal direction (A) that is folded to extend along the lower side of the insulating base 10, extends approximately in a straight-line form and has an arcuate recess 77 (see FIG. 27) provided in the center thereof. The retaining portion 17c is molded over the end edge 73 so as to retain the end edge 73 at a plurality of positions (five positions). The surface of the portion of the flexible circuit board 20 that is folded to extend along the lower side of the insulating base 10 is recessed from the surface of the rest of the lower side of the insulating base 10 to form a recess 78. The depth of the recess 78 is approximately equal to the thickness of the terminal plates 70. The terminal plates 70 are mounted on an end portion of the insulating base 10 on the side thereof where the recess 78 is provided so as to be connected to the terminal patterns 29 provided on the flexible circuit board 20.

That is, the eighth embodiment discloses an electronic component substrate 1-8 including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. Further, the electronic component substrate 1-8 has terminal plates 70 mounted on an end portion of the insulating base 10 in electrical connection with the terminal patterns 29 provided on the flexible circuit board 20. Further, the electronic component substrate 1-8 has a collector plate 50-8 insert-molded to the insulating base 10.

Further, the eighth embodiment is an electronic component substrate 1-8 including an insulating base 10 and a flexible circuit board 20 mounted on the insulating base 10. The flexible circuit board 20 is a synthetic resin film provided thereon with terminal patterns 29 and a conductor pattern 25 whose surface is slidingly contacted with a slider. The insulating base 10 is a synthetic resin molded piece. The flexible circuit board 20 is insert-molded to the insulating base 10. Further, the electronic component substrate 1-8 has terminal plates 70 mounted on an end portion of the insulating base 10 in electrical connection with the terminal patterns 29 provided on the flexible circuit board 20. The insulating base 10 is provided with retaining portions 17a, 17b and 17c for firmly securing the flexible circuit board 20 to the insulating base 10. Further, the electronic component substrate 1-8 has a collector plate 50-8 insert-molded to the insulating base 10.

Next, a method of producing the electronic component substrate 1-8 will be described. First, as shown in FIG. 27, a flexible circuit board 20 is prepared which has a through-hole 21 and resin insertion portions 75a and 75b and further has a resistor pattern 25 and terminal patterns 29 formed on the surface thereof. The resistor pattern 25 is formed from a metal thin film deposited by physical vapor deposition or chemical vapor deposition. The flexible circuit board 20 has connecting portions 31 projecting from both side edges of a portion where the resistor pattern 25 is provided. A large number of identical flexible circuit boards 20 (not shown) are connected in parallel through the connecting portions 31.

Figure 28:
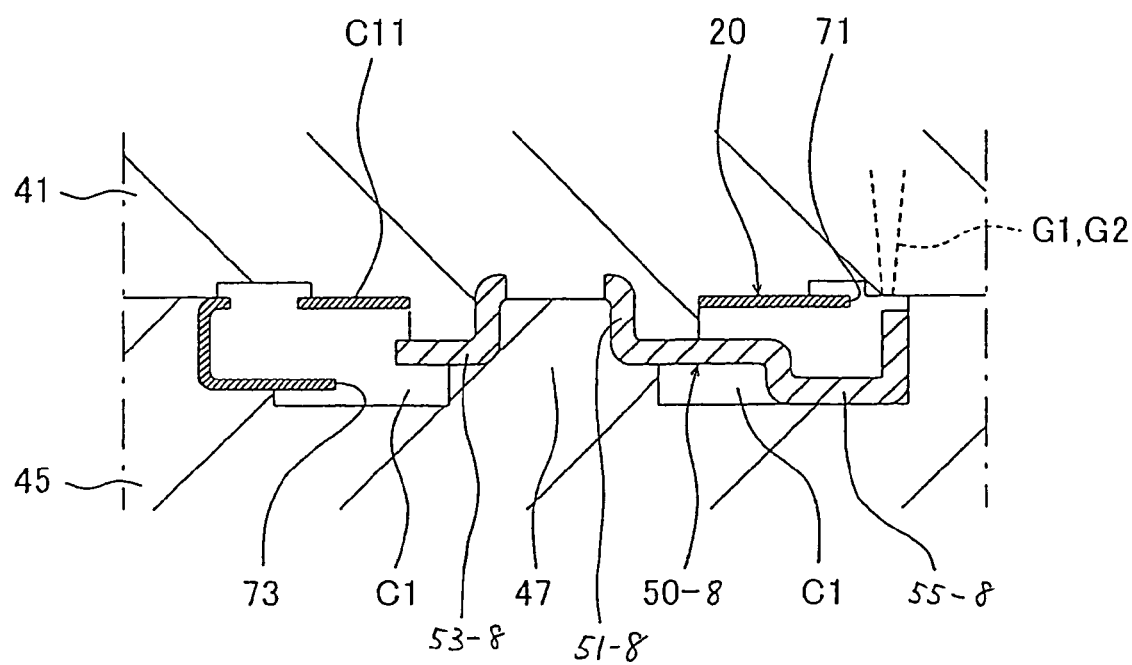
FIG. 28 is a diagram illustrating the method of producing the electronic component substrate 1-8.

Next, as shown in FIG. 28, the flexible circuit board 20 and the collector plate 50-8 are inserted between a first mold member 41 and a second mold member 45. At this time, a cavity C1 having the same shape as that of the electronic component substrate 1-8 is formed between the first and second mold members 41 and 45. The surface of the flexible circuit board 20 where the resistor pattern 25 is formed is abutted against an inner plane surface C11 of the cavity C1 on the side of the first mold member 41. Moreover, the portion of the flexible circuit board 20 closer to one end edge 73 where the terminal patterns 29 are provided is folded over toward the second mold member 45. It should be noted that the reason why the recess 77 (see FIG. 27) is provided on the end edge 73 of the flexible circuit board 20 is to prevent the flexible circuit board 20 from contacting a projection 47, which is provided on the second mold member 45 to form the through-hole 11, when the portion of the flexible circuit board 20 closer to the end edge 73 is folded over toward the second mold member 45.

Then, a heated molten synthetic resin is injected from two resin injection ports [shown by arrows G1 and G2 in FIG. 25(a) and G1 and G2 in FIG. 28) provided on the mold member 41 side to fill the cavity C1 with the molten resin. The injection pressure and heat of the molten resin cause the flexible circuit board 20 to be pressed against the inner peripheral surface of the cavity C1 and deformed into the inner peripheral surface configuration. In this state, the injected resin is cooled and solidified. Then, the first and second mold members 41 and 45 are removed, and the connecting portions 31 projecting from both sides of the molded insulating base 10 are cut off. Further, U-shaped terminal plates 70 are mounted on an end portion on the side of the insulating base 10 where the recess 78 is provided, so as to cover the terminal patterns 29, and secured by clamping on the insulating base 10. Thus, the electronic component substrate 1-8 shown in FIGS. 25(a) and (b) is completed. The terminal plates 70 may be secured only with mechanical pressure contact force obtained from the terminal plates 70. Alternatively, the terminal plates 70 may be connected through an electrically conductive adhesive or the like. It should be noted that the configuration and mounting structure of the terminal plates 70 are not necessarily limited to those in this embodiment, but the terminal plates 70 may adopt any mounting structure, provided that the terminal plates 70 are mounted on the end portion of the insulating base 10 in electrical connection with the terminal patterns 29.

That is, the eighth embodiment is a method of producing an electronic component substrate 1-8 by preparing a flexible circuit board 20 comprising a synthetic resin film provided thereon with a conductor pattern 25, the surface of which is slidingly contacted with a slider, and terminal patterns 29 connected to the conductor pattern 25, and further preparing terminal plates 70 made of metal sheets and mold members 41 and 45 having a cavity C1 with a shape that corresponds to the external shape of the electronic component substrate 1-8 to be produced. Then, the flexible circuit board 20 is accommodated in the cavity C1 between the mold members 41 and 45. At this time, the surface of the flexible circuit board 20 where the conductor pattern 25 is provided is abutted against one inner surface C11 of the cavity C1 (surface of the first mold member 41). Then, a molten molding resin is filled into the cavity C1. After the filled molding resin has been solidified, the mold members 41 and 45 are removed, whereby the flexible circuit board 20 is mounted on the insulating base 10 made of the molding resin in such a way that the conductor pattern 25 and the terminal patterns 29 are exposed. Thereafter, the terminal plates 70 are mounted on an end portion of the insulating base 10 in electrical connection with the terminal patterns 29 provided on the flexible circuit board 20. Further, a collector plate 50-8 made of a metal sheet is accommodated in the cavity C1 between the mold members 41 and 45 at the same time as the flexible circuit board 20 is accommodated in the cavity C1, thereby embedding the collector plate 50-8 in the insulating base 10 made of the molding resin.

It should be noted that the reason why the end edge 73 and its vicinities are retained discontinuously at a plurality of positions with the retaining portion 17c as stated above is to abut a part of the end edge 73 against the surface of the second mold member 45 to thereby hold the end edge 73 so that this portion will not be deformed by being pushed down to the surface of the second mold member 45 by the injection pressure of the molten molding resin. In other words, the end edge 73 and its vicinities exposed on the lower side of the insulating base 10 without being covered with the retaining portion 17c are formed as the result of holding the end edge 73 and its vicinities by the second mold member 45.

With the electronic component substrate 1-8, the portion of the flexible circuit board 20 provided on the upper side of the insulating base 10 and the portion of the flexible circuit board 20 provided on the lower side of the insulating base 10 are provided with the retaining portions 17a to 17c, respectively, for firmly securing the flexible circuit board 20 to the insulating base 10. Therefore, even if the flexible circuit board 20 and the insulating base 10 are made of a combination of materials that are not easily fixed to each other only with the heat and pressure applied during insert molding, the flexible circuit board 20 can be easily and firmly secured to the insulating base 10 without the occurrence of such a problem that the flexible circuit board 20 separates from the surface of the insulating base 10. It should be noted that in this embodiment the retaining portions 17a to 17c are provided for the resistor pattern-side end edge 71 of the flexible circuit board 20 provided on the upper side of the insulating base 10 and for the portions near the outer peripheries of the ends 25e of the resistor pattern 25 and further for the terminal pattern-side end edge 73 provided on the lower side of the insulating base 10. However, in a case where the flexible circuit board 20 is fixed to the insulating base 10 relatively firmly, it may be only necessary to provide a retaining portion for any one of the three positions.

With the electronic component substrate 1-8 produced as stated above, the tubular projection 51-8 is passed through a fitting hole 61 of a slider 60 similar to that shown in FIG. 23, and the distal end of the tubular projection 51-8 is caulked, thereby mounting the slider 60 rotatably. Thus, a pre-set variable resistor is constructed.

Although in this embodiment the terminal plates 70 are mounted on the insulating base 10 after it has been integrally molded with the flexible circuit board 20, it should be noted that the terminal plates 70 may be integrally mounted on the insulating base 10 at the same time as the molten resin is injection-molded by previously accommodating the terminal plates 70 in the cavity C1 between the first and second mold members 41 and 45, together with the flexible circuit board 20 and the collector plate 50-8.

Although the embodiments of the present invention have been stated above, the present invention is not necessarily limited to the foregoing embodiments but can be modified in a variety of ways without departing from the technical idea described in the claims, the specification and the accompanying drawings. It should be noted that any configuration, structure or material that offers the action and effect of the invention of this application falls within the scope of the technical idea of the invention of this application even if it is not directly described in the specification or the drawings. For example, the configuration of the terminal plates 70 can be modified in a variety of ways. The terminal plates 70 may have any configuration and any mounting structure, provided that they can be mounted on an insulating base end portion in electrical connection with the terminal patterns provided on the flexible circuit board.

Although in the foregoing embodiments a resistor pattern is used as a conductor pattern, various other patterns, e.g. a switch pattern, may be used. When it is provided, the switch pattern and terminal patterns may be formed from the same material at the same step. Although in the foregoing embodiments a metal thin film formed by physical vapor deposition or chemical vapor deposition is used as a conductor pattern, it is also possible to use a resistor paste prepared by mixing an electrically conductive powder into a resin. It is also possible to use a conductor pattern formed by etching a metal foil. Thus, various changes may be made to the formation of the conductor pattern. Although in the foregoing embodiments the resistor pattern 25 is provided over the terminal patterns 29, the terminal patterns 29 may be provided over the resistor pattern 25 in reverse to the above.

INDUSTRIAL APPLICABILITY

As has been stated above, the electronic component substrate and the production method therefor according to the present invention are useful for providing a substrate for a pre-set variable resistor, a substrate for other various variable resistors and a substrate for a switch, and particularly suitable for use to facilitate the manufacture, reduce the material cost and achieve a reduction in thickness.

The invention claimed is:

1. A substrate for an electronic component, comprising:
an insulating base; and
a flexible circuit board mounted on said insulating base, said flexible circuit board being a synthetic resin film provided thereon with terminal patterns and a conductor pattern whose surface is slidingly contacted with a slider;
wherein said insulating base is a synthetic resin molded piece, and said flexible circuit board is insert-molded to said insulating base, and
wherein a collector plate provided with a tubular projection is insert-molded to said insulating base in such a way that said tubular projection is positioned in through holes respectively provided in said insulating base and said flexible circuit board.

2. A substrate for an electronic component according to claim 1, wherein said flexible circuit board is mounted on said insulating base by insert molding in a folded state so that a surface of said flexible circuit board is exposed on upper and lower sides of said insulating base.

3. A substrate for an electronic component according to claim 1, wherein said insulating base is provided with a retaining portion for firmly securing said flexible circuit board to said insulating base.

4. A substrate for an electronic component according to claim 1, wherein said conductor pattern is formed from a metal thin film deposited by physical vapor deposition or chemical vapor deposition.

5. A substrate for an electronic component according to claim 1, further comprising terminal plates mounted on an end portion of said insulating base in electrical connection with said terminal patterns provided on said flexible circuit board.

6. A substrate for an electronic component according to claim 5, wherein said insulating base is provided with a retaining portion for firmly securing said flexible circuit board to said insulating base.

7. A method of producing an electronic component substrate, comprising:
preparing a flexible circuit board comprising a synthetic resin film provided thereon with a conductor pattern, a surface of which is slidingly contacted with a slider, and terminal patterns connected to said conductor pattern, and further preparing a mold having a cavity with a shape that corresponds to an external shape of said electronic component substrate to be produced;
accommodating said flexible circuit board in the cavity of said mold in such a manner that a surface of said flexible circuit board where the conductor pattern is provided is abutted against one inner surface of the cavity, and a portion of said flexible circuit board on a side thereof where the terminal patterns are provided is folded over toward the other inner surface of the cavity;

filling said cavity with a molten molding resin, thereby bringing the folded portion of said flexible circuit board into close contact with a cavity wall area extending from an upper surface to a lower surface of the cavity along one outer peripheral side surface thereof; and removing the mold after the filled molding resin has been solidified, whereby the flexible circuit board is mounted on an insulating base made of the molding resin in such a way that a portion of said flexible circuit board where the conductor pattern is provided is exposed on an upper side of said insulating base, and a portion of said flexible circuit board on the side thereof where the terminal patterns are provided is exposed in a folded state over an area extending from one outer peripheral side to a lower side of said insulating base, wherein a collector plate made of a metal sheet is accommodated in the cavity of said mold at the same time as said flexible circuit board is accommodated in said cavity, thereby embedding the collector plate in the insulating base made of said molding resin.

8. A method of producing an electronic component substrate, the method comprising:

preparing a flexible circuit board comprising a synthetic resin film provided thereon with a conductor pattern, a surface of which is slidingly contacted with a slider, and terminal patterns connected to said conductor pattern, and further preparing terminal plates made of metal sheets and a mold having a cavity with a shape that corresponds to an external shape of the electronic component substrate to be produced;

accommodating said flexible circuit board in the cavity of said mold in such a manner that a surface of said flexible circuit board where the conductor pattern is provided is abutted against one inner surface of the cavity;

filling a molten molding resin into said cavity, and removing the mold after the filled molding resin has been solidified, whereby the flexible circuit board is mounted on an insulating base made of the molding resin in such a way that the conductor pattern and the terminal patterns are exposed; and mounting the terminal plates on an end portion of said insulating base in electrical connection with the terminal patterns provided on said flexible circuit board.

9. A method of producing an electronic component substrate according to claim 8, wherein a collector plate made of a metal sheet is accommodated in the cavity of said mold at the same time as said flexible circuit board is accommodated in said cavity, thereby embedding the collector plate in the insulating base made of said molding resin.

10. A method of producing an electronic component substrate, comprising:

preparing a flexible circuit board comprising a synthetic resin film provided thereon with a conductor pattern, a surface of which is slidingly contacted with a slider, and terminal patterns connected to the conductor pattern, and further preparing terminal plates made of metal sheets and a mold having a cavity with a shape that corresponds to an external shape of the electronic component substrate to be produced;

accommodating said flexible circuit board and said terminal plates in the cavity of said mold in such a manner that a surface of said flexible circuit board where the conductor pattern is provided is abutted against one inner surface of the cavity, and at the same time, the terminal plates are partially abutted against or opposed to the terminal patterns on said flexible circuit board; and filling said cavity with a molten molding resin, and removing the mold after the filled molding resin has been solidified, whereby the flexible circuit board is mounted on an insulating base made of the molding resin in such a way that the conductor pattern and the terminal patterns are exposed, and at the same time, the terminal plates are mounted on an end portion of the insulating base in electrical connection with the terminal patterns provided on said flexible circuit board, wherein a collector plate made of a metal sheet is accommodated in the cavity of said mold at the same time as said flexible circuit board is accommodated in said cavity, thereby embedding the collector plate in the insulating base made of said molding resin.

* * * * *